United States Patent
Kikuchi et al.

(10) Patent No.: US 7,982,538 B2
(45) Date of Patent: Jul. 19, 2011

(54) DIFFERENTIAL OUTPUT CIRCUIT AND COMMUNICATION DEVICE

(75) Inventors: Hidekazu Kikuchi, Kanagawa (JP); Gen Ichimura, Tokyo (JP); Yukihisa Kinugasa, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/617,262

(22) Filed: Nov. 12, 2009

(65) Prior Publication Data

US 2010/0120383 A1    May 13, 2010

(30) Foreign Application Priority Data

Nov. 12, 2008   (JP) .................................. 2008-290189

(51) Int. Cl.
*H03F 3/45* (2006.01)
(52) U.S. Cl. ...................................................... 330/257
(58) Field of Classification Search ................. 330/252, 330/253, 257
See application file for complete search history.

(56) References Cited

U.S. PATENT DOCUMENTS

| | | | |
|---|---|---|---|
| 5,399,991 A | | 3/1995 | Moraveji |
| 5,654,629 A | * | 8/1997 | Theus ........................... 323/316 |
| 6,566,851 B1 | | 5/2003 | Schuelke et al. |
| 6,696,895 B2 | * | 2/2004 | Tsukuda ........................ 330/264 |
| 2005/0218983 A1 | | 10/2005 | Matsuda et al. |
| 2008/0024225 A1 | | 1/2008 | Tsutsui et al. |

FOREIGN PATENT DOCUMENTS

| | | |
|---|---|---|
| EP | 0 760 555 A1 | 3/1997 |
| EP | 1 885 061 A1 | 7/2006 |
| JP | 2005-267700 A | 9/2005 |
| JP | 2008-042521 A | 2/2008 |

* cited by examiner

*Primary Examiner* — Steven J Mottola
(74) *Attorney, Agent, or Firm* — Wolf, Greenfield & Sacks, P.C.

(57) ABSTRACT

A differential includes first and second current mirror circuits that provide the gates of slave transistors with gate voltages of master transistors via a voltage follower where a slew rate at a rise time is equal to a slew rate at a fall time. Thus, when the master current is increased or decreased, an incremental change in slave current and a decremental change in slave current are symmetrical with each other. The use of such current mirrors in a differential manner leads to no generation of common mode noise even in these changes.

13 Claims, 14 Drawing Sheets

DIFFERENTIAL OUTPUT CIRCUIT AND COMMUNICATION DEVICE

BACKGROUND OF THE INVENTION

1. Field of the Invention

The present invention relates to a differential output circuit using current mirror circuits in a differential manner and a communication device using such a differential output circuit.

2. Description of the Related Art

FIG. 1 is a diagram illustrating an exemplary configuration of a general differential output circuit that uses current mirror circuits in a differential manner.

As shown in FIG. 1, the differential output circuit 1 includes p-channel MOS (PMOS) transistors Q1 to Q4, current sources I1 and I2, a bias power supply VB, and load resistors Rload1 and Rload2. In FIG. 1, C1 and C2 represent capacitors, respectively.

Among these structural components, a first current mirror circuit CM1 is constructed of the PMOS transistors Q1 and Q2, the current source I1, and the load resistor Rload1, and the capacitor C1. In contrast, a second current mirror circuit CM2 is constructed of the PMOS transistors Q3 and Q4, the current source I2, the load resistor Rload2, and the capacitor C2. In each of the PMOS transistors Q1 and Q2, the gate and the drain thereof are diode-connected to each other.

In the differential output circuit 1, a voltage change in the gate G1 of the transistor Q1 when increasing or decreasing the master current IinP of the first current mirror circuit CM1 can be determined by the diode differential resistance of the transistor Q1 and the capacitor C1 of gate G1. For example, since a diode dynamic resistance is small in a state of being biased with a large current, the gate voltage changes quickly in such a state and the output of the slave transistor Q2 then changes quickly. Conversely, the diode differential resistance is high in a state of being biased with a small current, so that both a gate potential and a slave current will change slowly.

SUMMARY OF THE INVENTION

However, when the current varies significantly, a change in slave current at a time of an incremental change in current is not symmetrical to a change in slave current at a time of a decremental change in current. Therefore, even if two current mirrors are used to provide a master current with a differential current signal, a change in slave current causes common-mode noise as a result of differential symmetrical turbulence.

FIG. 2 is a diagram illustrating a typical differential output obtained when a load resistor is connected to a slave output. An average voltage of differential outputs, or common-mode components, occurs. This noise has a disadvantage in that a radiation may tend to occur when transmitting a differential signal to a long distance. In addition, when an additional common-mode signal is asynchronously superimposed on the differential signal, there is a disadvantage in that a common-mode component output with a change in output of the differential current mirror becomes noise and interferes in communication.

Therefore, it is desirable to provide a differential output circuit which is capable of inhibiting generation of common-mode noise and a communication device using such a differential output circuit.

According to a first embodiment of the present invention, there is provided a differential output circuit that includes at least a first current mirror circuit, a second current mirror circuit, a first load resistor and a second load resistor, which are connected to each other with their ends, and a bias power supply that biases a connecting node between the end of the first load resistor and the end of the second load resistor to a predetermined potential. In such a differential output circuit, the first current mirror circuit includes: a first master transistor to which a gate and a drain are connected; a first current source connected to the drain of the first master transistor; a first slave transistor having a drain connected to the other end of the first load resistor; and a first voltage follower that supplies a gate voltage of the first master transistor to the gate of the first slave transistor, where a slew rate at a rise time is equal to a slew rate at a fall time. In addition, the second current mirror circuit includes: a second master transistor to which a gate and a drain are connected; a second current source connected to the drain of the second master transistor; a second slave transistor having a drain connected to the other end of the second load resistor; and a second voltage follower that supplies a gate voltage of the second master transistor to the gate of the second slave transistor, where a slew rate at a rise time is equal to a slew rate at a fall time.

According to a second embodiment of the present invention, there is provided a differential output circuit that includes: a first load resistor and a second load resistor, which are connected to each other with their ends; and a bias power supply that biases a connecting node between the end of the first load resistor and the end of the second load resistor to a predetermined potential. The differential output circuit further includes: a gate drive circuit; a first master transistor to which a gate and a drain are connected; a first current source connected to the drain of the first master transistor; a first slave transistor having a drain connected to the other end of the first load resistor; a second master transistor to which a gate and a drain are connected and a second current source connected to the drain of the second master transistor; and a second slave transistor having a drain connected to the other end of the second load resistor. In the differential output circuit, gate voltages are supplied from the first master transistor and the second master transistor to the gate drive circuit. In addition, an upper clamp level and a lower clamp level are set to the gate voltages from the first slave transistor and the second slave transistor. Also, a voltage is changed from one clamp level to the other clamp level at a predetermined slew rate. Furthermore, the voltage is supplied to the gate of the first slave transistor and the gate of the second slave transistor. Besides, a current mirror is formed using the first master transistor and the first slave transistor and a current mirror is formed using the second master transistor and the second slave transistor. Alternatively, a current mirror is formed using the first master transistor and the second slave transistor and a current mirror is formed using the second master transistor and the first slave transistor.

According to a third embodiment of the present invention, there is provided a communication device that includes: a plurality of transmitters arranged on both end sides of a differential transmission line. In this communication device, each of the transmitters includes: a differential output circuit capable of supplying a differential output to the differential transmission line. Here, the differential output circuit includes: at least a first current mirror circuit; a second current mirror circuit; a first load resistor and a second load resistor, which are connected to each other with their ends; and a bias power supply that biases a connecting node between the end of the first load resistor and the end of the second load resistor to a predetermined potential. In this communication device, the first current mirror circuit includes: a first master transistor to which a gate and a drain are connected; a first current source connected to the drain of the first master transistor; a first slave transistor having a drain connected to the other end of the first load resistor; and a first voltage follower that supplies a gate voltage of the first master transistor to the gate of the first slave transistor. Here, a slew rate at a rise time is equal to a slew rate at a fall time. In addition, the second current mirror circuit includes: a second master transistor to which a gate and a drain are connected; a second current source connected to the drain of the second master transistor; a second slave transistor having a drain connected to the other end of the second load resistor; and a second voltage follower that supplies a gate voltage of the second master transistor to the gate of the second slave transistor, where a slew rate at a rise time is equal to a slew rate at a fall time.

According to a fourth embodiment of the present invention, there is provided a communication device that includes a plurality of transmitters arranged on both end sides of a differential transmission line. Here, each of the transmitters includes a differential output circuit capable of supplying a differential output to the differential transmission line. In this differential transmission, the differential output circuit includes: a first load resistor and a second load resistor, which are connected to each other with their ends; a bias power supply that biases a connecting node between the end of the first load resistor and the end of the second load resistor to a predetermined potential; a gate drive circuit; a first master transistor to which a gate and a drain are connected; a first current source connected to the drain of the first master transistor; a first slave transistor having a drain connected to the other end of the first load resistor; a second master transistor to which a gate and a drain are connected; a second current source connected to the drain of the second master transistor; and a second slave transistor having a drain connected to the other end of the second load resistor. Here, the communication device acts as follows: First, gate voltages are supplied from the first master transistor and the second master transistor to the gate drive circuit and an upper clamp level and a lower clamp level are then set to the gate voltages from the first slave transistor and the second slave transistor. In addition, a voltage is changed from one clamp level to the other clamp level at a predetermined slew rate. Furthermore, the voltage is supplied to the gate of the first slave transistor and the gate of the second slave transistor. Moreover, a current mirror is formed using the first master transistor and the first slave transistor and a current mirror is formed using the second master transistor and the second slave transistor. Alternatively, a current mirror is formed using the first master transistor and the second slave transistor and a current mirror is formed using the second master transistor and the first slave transistor.

According to any of the above embodiments of the present invention, for example in current mirror circuits, a gate voltage of a master transistor is supplied to the gate of a slave transistor via a voltage follower where a slew rate at a rise time is equal to a slew rate at a fall time. Therefore, when the master current is increased or decreased, an incremental change in slave current and a decremental change in slave current are symmetrical with each other. If the current mirrors are used in a differential manner, there is no common-mode noise occurred even in these changes.

DESCRIPTION OF THE PREFERRED EMBODIMENTS

Hereinafter, embodiments of the present invention will be described with reference to the attached drawings. The embodiments will be described in the following order:
1. First Embodiment (first exemplary configuration of differential output circuit);
2. Second Embodiment (second exemplary configuration of differential output circuit);
3. Third Embodiment (third exemplary configuration of differential output circuit);
4. Fourth Embodiment (fourth exemplary configuration of differential output circuit);
5. Fifth Embodiment (fifth exemplary configuration of differential output circuit);
6. Sixth Embodiment (sixth exemplary configuration of differential output circuit);
7. Seventh Embodiment (first exemplary configuration of communication device);
8. Eighth Embodiment (second exemplary configuration of communication device);
9. Ninth Embodiment (third exemplary configuration of communication device);
10. Tenth Embodiment (fourth exemplary configuration of communication device);
11. Eleventh Embodiment (fifth exemplary configuration of communication device); and 12. Twelfth Embodiment (exemplary configuration of terminal circuit).

1. First Embodiment

Figure 3:
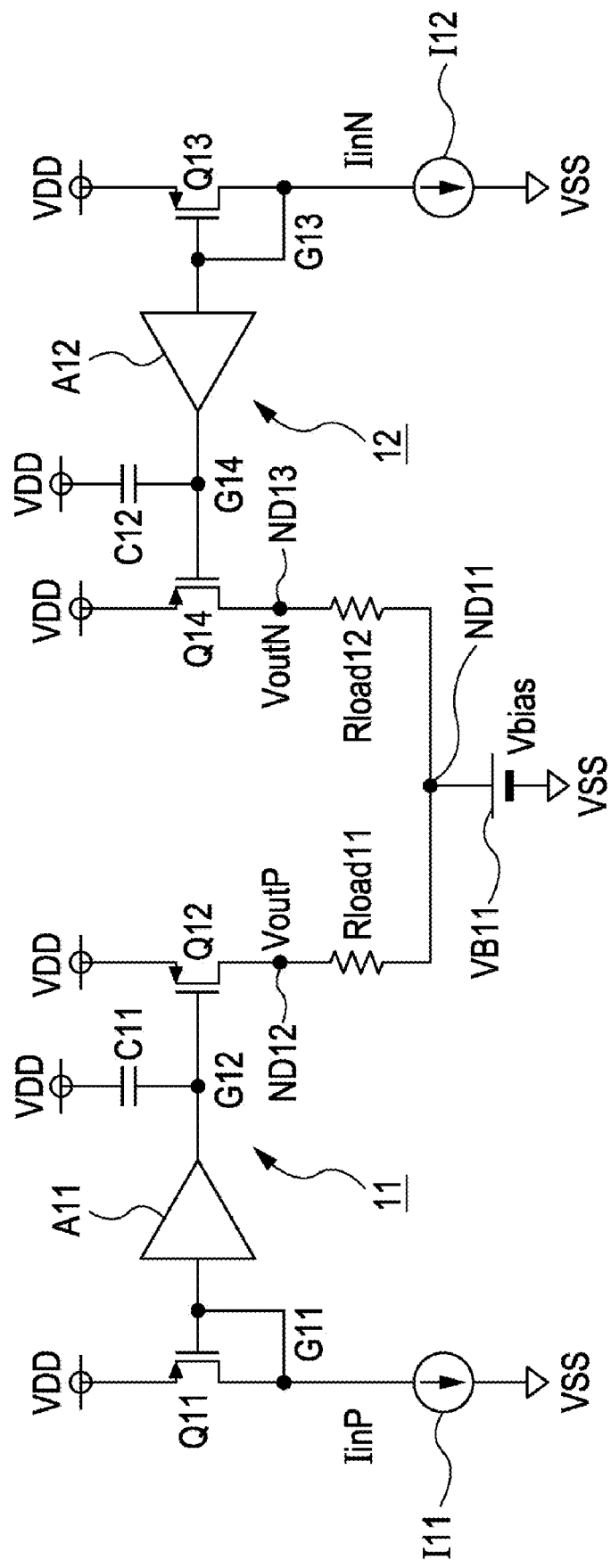
FIG. 3 is a circuit diagram illustrating an exemplary configuration of a differential output circuit according to a first embodiment of the present invention.

FIG. 3 is a circuit diagram illustrating an exemplary configuration of a differential output circuit according to a first embodiment of the present invention.

The differential output circuit 10 includes a first current mirror circuit 11, a second current mirror circuit 12, and a first load resistor Rload11 and a second load resistor Rload12 which are connected to each other with their ends. Furthermore, the differential output circuit 10 includes a bias power supply VB11 so that a connecting node ND11 between the end of the first load resistor Rload11 and the end of the second load resistor Rload12 can be biased to a predetermined potential Vbias.

The first current mirror circuit 11 includes a first master transistor Q11, a first current source I11, a first slave transistor Q12, a first voltage follower A11, and a capacitor C11

The first master transistor Q11 is a PMOS transistor, a field-effect transistor of a first conductivity type, for example, a p-channel type (P-type).

The first master transistor Q11 is a so-called diode-connected transistor connecting to a drain and a gate. The source of the transistor Q11 is connected to a power supply potential source VDD and the drain thereof is connected to a current source I11.

The first slave transistor Q12 is a PMOS transistor, a field-effect transistor of a first conductivity type, for example, a p-channel type (P-type). The first slave transistor Q12 has a drain connecting to the other end of the first load resistor Rload11, and such a junction forms a first output node ND12. From differential output signals, a first differential output signal VoutP is output from the first output node ND12. In the first slave transistor Q12, a source is connected to a power supply potential source VDD and a gate is connected to the output of a first voltage follower A11. In addition, a capacitor C11 exists between the gate of the transistor Q12 and the power supply potential source VDD.

The first voltage follower A11, where a slew rate at a rise time is equal to a slew rate at a fall time, supplies the gate voltage of the first master transistor Q11 to the gate of the first slave transistor Q12.

The second current mirror circuit 12 includes a second master transistor Q13, a second current source I12, a second slave transistor Q13, a second voltage follower A12, and a capacitor C12.

The second master transistor Q13 is a PMOS transistor, a field-effect transistor of a first conductivity type, for example, a p-channel type (P-type). The second master transistor Q13 is a so-called diode-connected transistor connecting to a drain and a gate. The source of the transistor Q13 is connected to a power supply potential source VDD and the drain thereof is connected to a current source I12.

The second slave transistor Q14 is a PMOS transistor, a field-effect transistor of a first conductivity type, for example, a p-channel type (P-type). The second slave transistor Q14 has a drain connecting to the other end of the second load resistor Rload12, and such a junction forms a second output node ND13. From differential output signals, a second differential output signal VoutN is output from the second output node ND13. In the second slave transistor Q14, a source is connected to a power supply potential source VDD and a gate is connected to the output of a second voltage follower A12. In addition, a capacitor C12 exists between the gate of the transistor Q14 and the power supply potential source VDD.

The second voltage follower A12, where a slew rate at a rise time is equal to a slew rate at a fall time, supplies the gate voltage of the second master transistor Q13 to the gate of the second slave transistor Q14.

Thus, the differential output circuit 10 according to the first embodiment is formed as a current-source type output circuit constructed of PMOS current mirror circuits.

Now, the configuration of the differential output circuit 10 of the present embodiment will be described by taking the first current mirror circuit 11 as an example. In the current mirror circuit 11, the voltage follower A11 where a slew rate at a rise time is equal to a slew rate at a fall time is arranged between the first master transistor Q11 and the first slave transistor Q12. The gate G11 of the first master transistor Q1 is only provided with parasitic capacitance of the current source I11 of the master current IinP, the first master transistor Q11, and the first voltage follower A11. Therefore, the transition time in the gate G11 when the output of current IinP from the current source I11 is changed in a stepwise manner can be extremely shorter than the transition time of output from the differential output circuit 10.

After the input of the gate G11 changes, the first voltage follower A11 drives the gate G12 of the first slave transistor Q12 so that the potential of the gate 12 can follow the potential of the gate G11 at a constant slew rate. This slew rate is determined by the output current of the first voltage follower A11 and the capacitance of the gate G12, but not based on the bias state of the first master transistor Q11. Therefore, the gate G12 of the first slave transistor Q12 can be driven with the same slew rate with respect to either an incremental change in current or a decremental change in current.

The following phenomenon will occur when differential current signals are applied to a pair of current mirror circuits via the voltage follower as described above. In other words, a change in voltage of the gate G12 of the first slave transistor Q12 in the first current mirror circuit 11 and a change in voltage of the gate G14 of the second slave transistor Q14 in the second current mirror circuit 12 are inversely-symmetrical with each other with respect to their polarities. Likewise, as a result, an output current from the first slave transistor Q12 and an output current from the second slave transistor Q14 are substantially symmetrical with each other. Thus, differential signals with few common-mode components and the sum thereof is substantially constant. Strictly considered, the sum of output currents being changed may not be constant because of current distortion due to the nonlinearities of the transistors. However, such a change is smaller than a change in sum of currents caused by asymmetrical changes of the gates Gil and G12 due to changes in diode resistances of the transistors Q11 and Q12. Furthermore, the change of current sum due to the distortion can be further reduced by placing a linear resistor between the transistor and the power supply.

Figure 1:
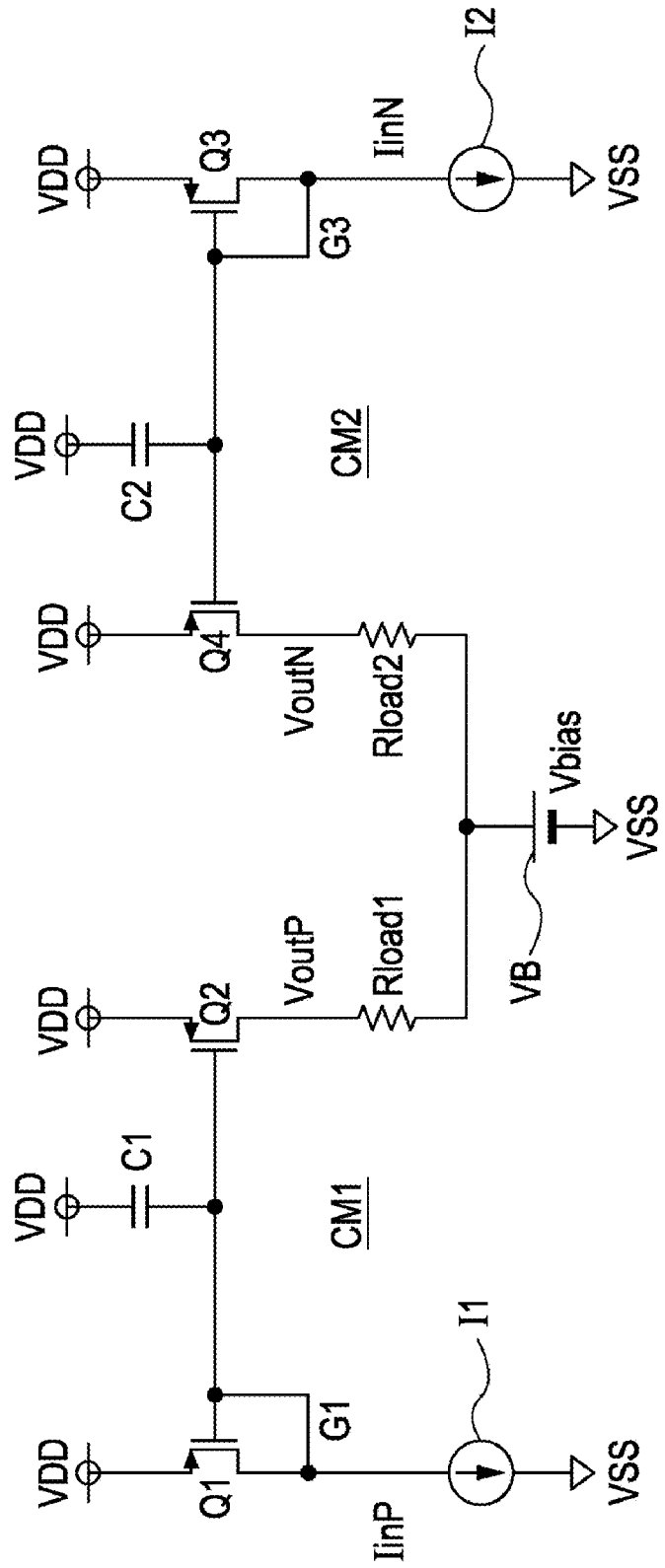
FIG. 1 is a diagram illustrating an exemplary configuration of a general differential output circuit that uses current mirror circuit in a differential manner.
Figure 2:
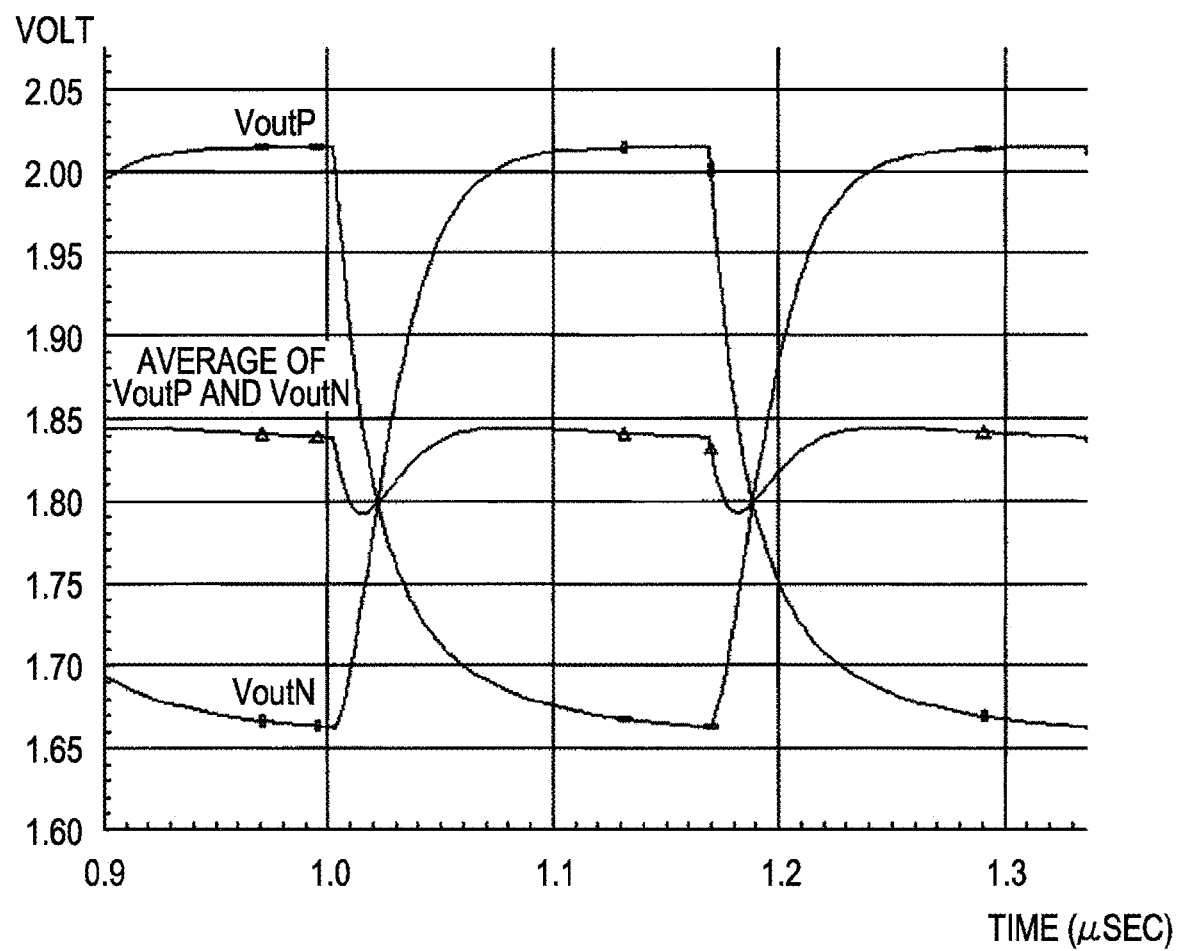
FIG. 2 is a diagram illustrating a typical output waveform of a general differential output circuit.

The complementarity of the differential currents of the differential output circuit 10 according to the present embodiment will now be considered in comparison with the circuit shown in FIG. 1.

The differential output circuit 10 of the present embodiment has a constant sum of the drain current of first slave transistor Q12 and the drain current of the second slave transistor Q14.

In the circuit shown in FIG. 1, in contrast, part of the current may flow into a capacitance parasitic between the transistors Q2 and Q4 even if the signal source currents IinP and IinN can be changed with perfect complementarity. Therefore, the instantaneous values of currents passing through the diode-connected master transistors Q1 and Q2 are hardly symmetrical with each other. As a result, the output current from the transistor Q2 controlled by the potential of the gate G1 of the transistor Q1 and the output current from the transistor Q4 controlled by the potential of the gate G3 of the transistor Q4 are also hardly symmetrical with each other.

On the other hand, in the differential output circuit 10 of this embodiment, the parasitic capacitance is divided by insertion of the first voltage follower A11 and the second voltage follower A12. Therefore, the time constants of the respective gates G11 and G13 can be made small enough to changes in signal source currents, respectively. In other words, a change in current of the diode-connected first master transistor Q11 and a change in current of the diode-connected second master transistor Q13 follow signal source currents substantially in a complete manner. Then, the sum of the currents can be kept constant and complementarity between the currents can be thus retained. The first voltage follower A11 regenerates the potential of the gate G12 from the potential of the gate G11. The second voltage follower A12 regenerates the potential of the gate G14 from the potential of the gate G13. Thus, the output current of the slave transistor Q12 and the output current of the slave transistor Q14 can retain their complementarity.

According to the first embodiment, differential signals with few common-mode signal components can be advantageously driven and, as a result, low-radiation communication becomes possible.

2. Second Embodiment

Figure 4:
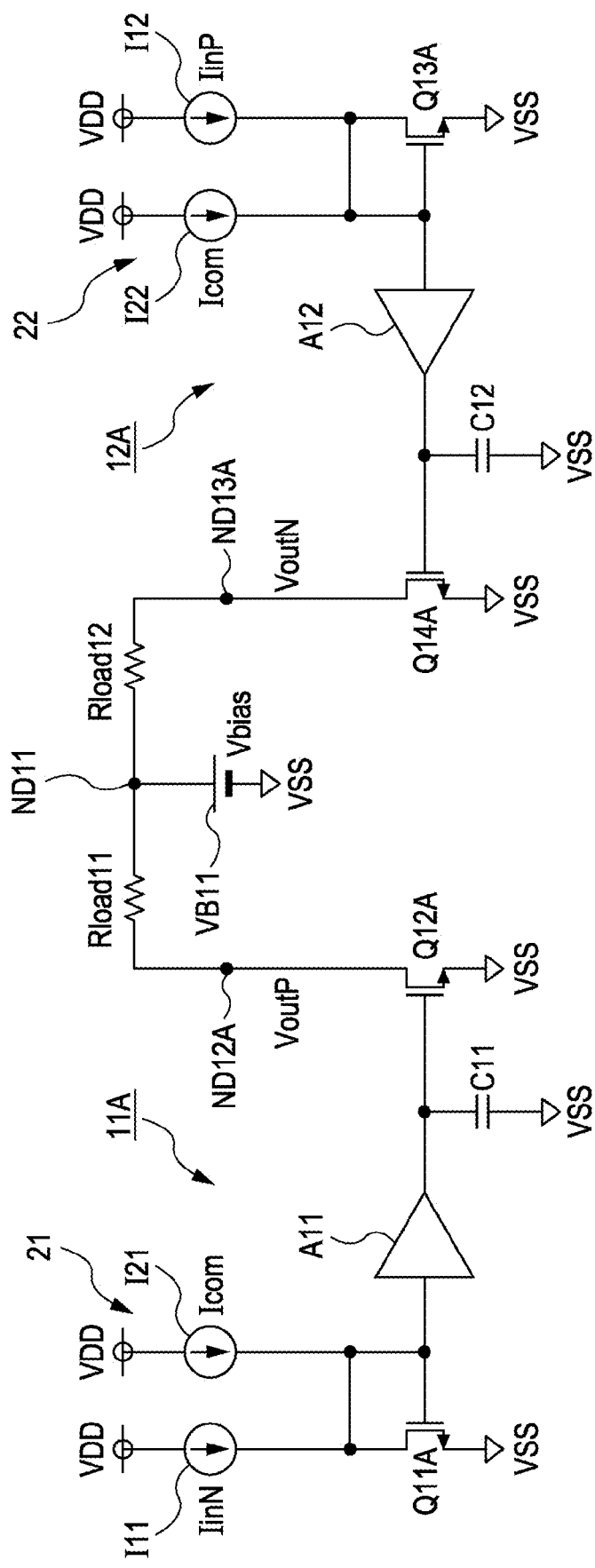
FIG. 4 is a circuit diagram illustrating an exemplary configuration of a differential output circuit according to a second embodiment of the present invention.

FIG. 4 is a circuit diagram illustrating an exemplary configuration of a differential output circuit according to a second embodiment of the present invention.

The differential output circuit 10A of the second embodiment differs from the differential output circuit 10 of the first embodiment as follows: In contrast to the differential output circuit 10 of the first embodiment which is designed as a current-source type using PMOS current mirrors, the differential output circuit 10A is designed as a current-sinking type where the polarities are reversed. Furthermore, the differential output circuit 10A of the second embodiment is connected to current sources I21 and I22 to superimpose differential signals IinP and IinN on first and second current mirror circuits 11A and 12A, respectively. The current source I21 and a connection circuit thereof form a superimposing section 21, and the current source I22 and a connection circuit thereof forms a superimposing section 22.

In FIG. 4, in order to easily understand the configuration of the differential output circuit 10A, the same structural components as those in FIG. 3 are designated by the same reference numerals.

The first master transistor Q11A is an NMOS transistor, a field-effect transistor of a second conductivity type, for example, an N-channel type (N-type). The first master transistor Q11A is a so-called diode-connected transistor connecting to a drain and a gate. The source of the transistor Q11A is connected to a reference potential source VSS and the drain and the gate thereof are connected to a current source I11 and a current source I21, respectively.

The first slave transistor Q12A is an NMOS transistor, a field-effect transistor of a second conductivity type, for example, an N-channel type (N-type). The first slave transistor Q12A has a drain connecting to the other end of the first load resistor Rload11, and such a junction forms a first output node ND12A. In the first slave transistor Q12A, a source is connected to a reference potential source VSS and a gate is connected to the output of a first voltage follower A11. In addition, a capacitor C11 exists between the gate of the transistor Q12A and the reference potential source VSS.

The second master transistor Q13A is an NMOS transistor, a field-effect transistor of a second conductivity type, for example, an N-channel type (N-type). The second master transistor Q13A is a so-called diode-connected transistor connecting to a drain and a gate. The source of the transistor Q13A is connected to a reference potential source VSS and the drain and the gate thereof are connected to a current source I12 and a current source I22, respectively.

The second slave transistor Q14A is an NMOS transistor, a field-effect transistor of a second conductivity type, for example, an N-channel type (N-type). The second slave transistor Q14A has a drain connecting to the other end of the second load resistor Rload12, and such a junction forms a second output node ND13A. In the second slave transistor Q14A, a source is connected to a reference potential source VSS and a gate is connected to the output of a second voltage follower A12. In addition, a capacitor C12 exists between the gate of the transistor Q14A and the reference potential source VSS.

In the differential output circuit 10A of the second embodiment, basically, other structural components are similar to those of the differential output circuit 10 of the first embodiment and differential signals and common-mode signals can be independently driven while the same effects as those of the first embodiment can be obtained.

3. Third Embodiment

Figure 5:
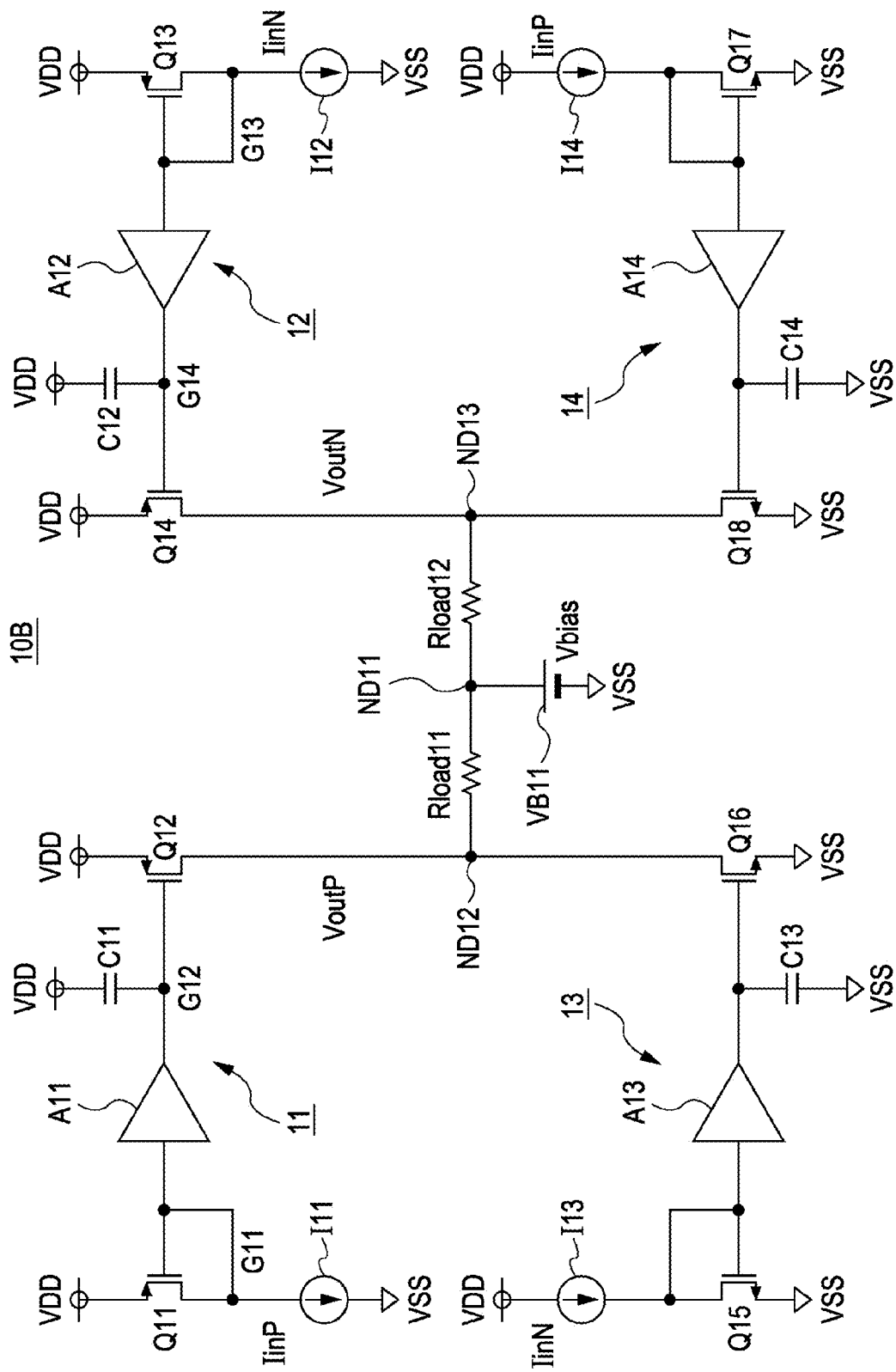
FIG. 5 is a circuit diagram illustrating an exemplary configuration of a communication device according to a third embodiment of the present invention.

FIG. 5 is a circuit diagram illustrating an exemplary configuration of a differential output circuit according to a third embodiment of the present invention.

The differential output circuit 10B of the third embodiment has the same configuration as that of the differential output circuit 10 of the first embodiment except for the following: The differential output circuit 10B of the third embodiment is constructed of a differential output circuit of a push-pull type using a current-sinking type output circuit in parallel therewith in addition to the differential output circuit 10 of the first embodiment, which is designed as a current-source type using PMOS current mirrors.

Specifically, in addition to a first current mirror circuit 11 and a second current mirror circuit 12, a third current mirror circuit 13 is connected to a first output node ND12 and a fourth current mirror circuit 14 is connected to a second output node ND 13.

The third current mirror circuit 13 includes a third master transistor Q15, a third current source I13, a third slave transistor Q16, a third voltage follower A13, and a capacitor C13.

The third master transistor Q15 is an NMOS transistor, a field-effect transistor of a second conductivity type, for example, an N-channel type (N-type). The third master transistor Q15 is a so-called diode-connected transistor connecting to a drain and a gate. The source of the transistor Q15 is connected to a reference potential source VSS and the drain thereof is connected to a current source I13.

The third slave transistor Q16 is an NMOS transistor, a field-effect transistor of a second conductivity type, for example, an N-channel type (N-type). The third slave transistor Q16 has a drain connecting to the other end of the first load resistor Rload11, and such a junction forms a first output node ND12. From differential output signals, a differential output signal VoutP is output from the first output node ND12. In the third slave transistor Q16, a source is connected to a reference potential source VSS and a gate is connected to the output of a first voltage follower A13. In addition, a capacitor C13 exists between the gate of the transistor Q16 and the reference potential source VSS.

The third voltage follower A13, where a slew rate at a rise time is equal to a slew rate at a fall time, supplies the gate voltage of the third master transistor Q15 to the gate of the third slave transistor Q16.

The fourth current mirror circuit 14 includes a fourth master transistor Q17, a fourth current source I14, a fourth slave transistor Q18, a fourth voltage follower A14, and a capacitor C14.

The fourth master transistor Q17 is an NMOS transistor, a field-effect transistor of a second conductivity type, for example, an N-channel type (N-type). The fourth master transistor Q17 is a so-called diode-connected transistor connecting to a drain and a gate. The source of the transistor Q17 is connected to a reference potential source VSS and the drain thereof is connected to a current source I14.

The fourth slave transistor Q18 is an NMOS transistor, a field-effect transistor of a second conductivity type, for example, an N-channel type (N-type). The fourth slave transistor Q18 has a drain connecting to the other end of the second load resistor Rload12, and such a junction forms a second output node ND13. From differential output signals, a second differential output signal VoutN is output from the second output node ND13. In the fourth slave transistor Q18, a source is connected to a reference potential source VSS and a gate is connected to the output of a fourth voltage follower A14. In addition, a capacitor C14 exists between the gate of the transistor Q18 and the reference potential source VSS.

The fourth voltage follower A14, where a slew rate at a rise time is equal to a slew rate at a fall time, supplies the gate voltage of the fourth master transistor Q17 to the gate of the second slave transistor Q18.

The differential output circuit 10B of the third embodiment is constructed of a differential output circuit of a push-pull type using a current-sinking type output circuit in parallel with the differential output circuit which is designed as a current-source type using PMOS current mirrors.

According to the differential output circuit 10B of the third embodiment, the same effects as those of the first embodiment can be obtained. In addition, the amount of circuit current used for imparting the same differential output as that of the output can be advantageously reduced to almost half of that of the first embodiment.

4. Fourth Embodiment

Figure 6:
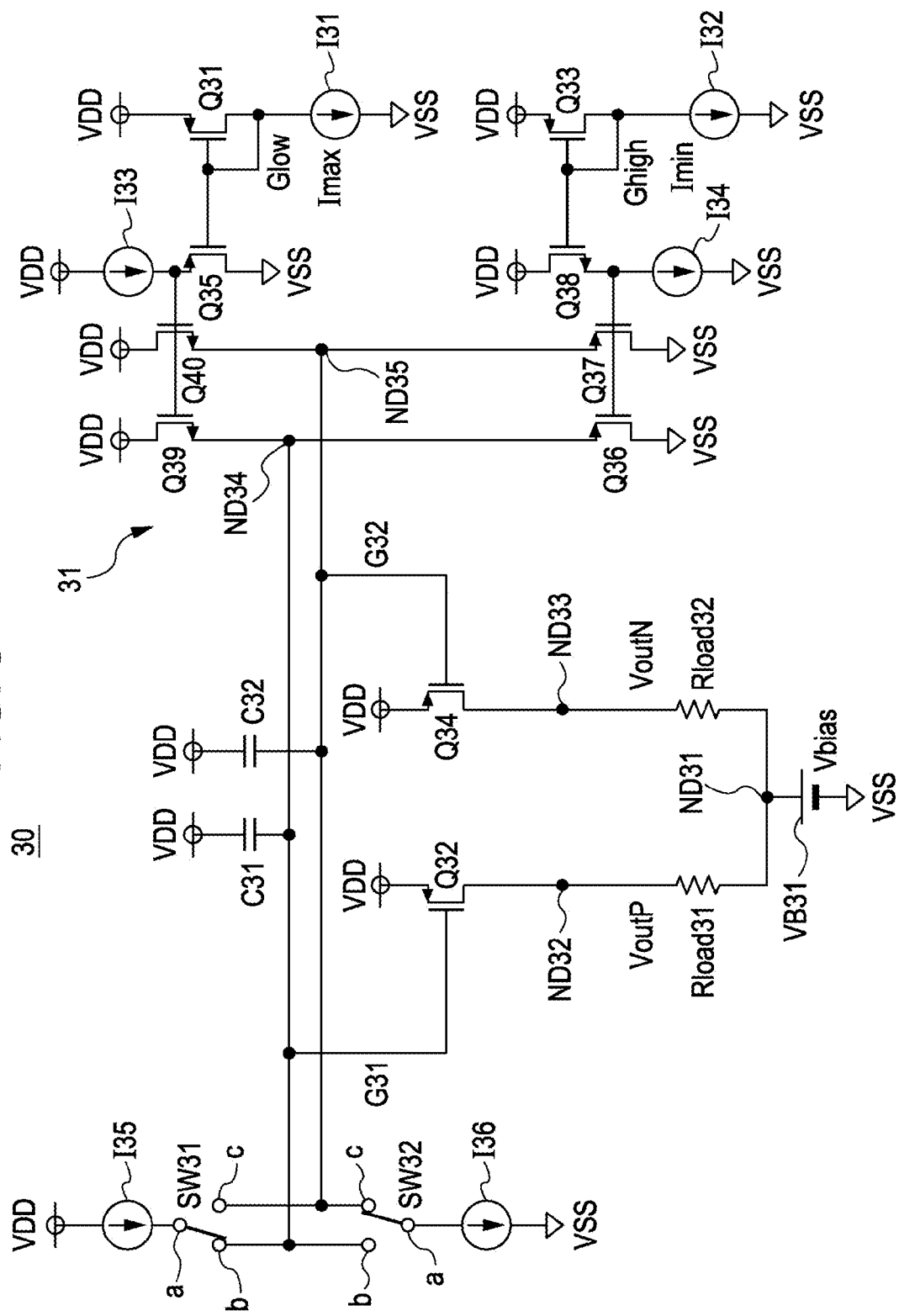
FIG. 6 is a circuit diagram illustrating an exemplary configuration of a differential output circuit according to a fourth embodiment of the present invention.

FIG. 6 is a circuit diagram illustrating an exemplary configuration of a differential output circuit according to a fourth embodiment of the present invention.

The differential output circuit 30 includes a first load resistor Rload31 and a second load Rload32 which are connected with each other with their ends. Furthermore, the differential output circuit 30 includes a bias power supply VB31 so that a connecting node ND31 between the end of the first load resistor Rload31 and the end of the second load resistor Rload32 can be biased to a predetermined potential Vbias.

The differential output circuit 30 includes a first master transistor Q31, a first current source I31, a first slave transistor Q32, and a capacitor C31. The differential output circuit 30 includes a second master transistor Q33, a second current source I32, a second slave transistor Q34, and a capacitor C32. Then, the differential output circuit 30 includes a gate drive circuit 31.

The gate drive circuit 31 receives gate voltages from the first master transistor Q31 and the second master transistor Q33 and then defines upper and lower clamp levels of the gate voltage of each of the first slave transistor Q32 and the second slave transistor Q34. Subsequently, the gate drive circuit 31 changes each of the voltages from one defined clamp level to the other clamp level at a predetermined slew rate and then supplies the voltages to the corresponding gates of the first slave transistor Q32 and the second slave transistor Q34. Therefore, the gate drive circuit 31 forms a current mirror circuit with the first master transistor Q31 and the first slave transistor Q32 and another current mirror circuit with the second master transistor Q33 and the second slave transistor Q34. Alternatively, the gate drive circuit 31 may form a current mirror circuit with the first master transistor Q31 and the second slave transistor Q34 and another current mirror circuit with the second master transistor Q33 and the first slave transistor Q32.

The first master transistor Q31 is a PMOS transistor, a field-effect transistor of a first conductivity type, for example, a p-channel type (P-type). The first master transistor Q31 is a so-called diode-connected transistor connecting to a drain and a gate. The source of the transistor Q31 is connected to a power supply potential source VDD and the drain thereof is connected to a current source I31.

The first slave transistor Q32 is a PMOS transistor, a field-effect transistor of a first conductivity type, for example, a p-channel type (P-type). The first slave transistor Q32 has a drain connecting to the other end of the first load resistor Rload31, and such a junction forms a first output node ND32. From differential output signals, a first differential output signal VoutP is output from the first output node ND32. In the first slave transistor Q32, a source is connected to a power supply potential source VDD and a gate is connected to the output of a first gate drive circuit 31.

In addition, a capacitor C31 exists between the gate of the transistor Q32 and the power supply potential source VDD. The second master transistor Q32 is a PMOS transistor, a field-effect transistor of a first conductivity type, for example, a p-channel type (P-type). The second master transistor Q33 is a so-called diode-connected transistor connecting to a drain and a gate. The source of the transistor Q33 is connected to a power supply potential source VDD and the drain thereof is connected to a current source I32.

The second slave transistor Q34 is a PMOS transistor, a field-effect transistor of a first conductivity type, for example, a p-channel type (P-type). The second slave transistor Q34 has a drain connecting to the other end of the second load resistor Rload32, and such a junction forms a second output node ND33. From differential output signals, a second differential output signal VoutN is output from the second output node ND33.

In the second slave transistor Q34, a source is connected to a power supply potential source VDD and a gate is connected to the output of a gate drive circuit 31. In addition, a capacitor C32 exists between the gate of the transistor Q34 and the power supply potential source VDD.

The gate drive circuit 31 includes current sources I33-I36, first-conductive type (e.g., P-type) PMOS transistors Q35, Q36, and Q37, second-conductive type (e.g., N-type) NMOS transistors Q38, Q39, and Q40, and switches SW31 and SW32.

The PMOS transistor Q35 has a gate connecting to the gate and drain of the first master transistor Q31, a source connecting to a power supply potential source VDD through current supply I33, and a drain connecting to a reference potential source VSS.

The NMOS transistor Q38 has a gate connecting to the gate and drain of the second master transistor Q33, a source connecting to a current supply I34 linked to a reference potential source VSS, and a drain connecting to a power supply source VDD.

The NMOS transistor Q39 has a drain connecting to a power supply potential source VDD and a source connecting to the source of the PMOS transistor Q36, and such a junction forms a node ND34. The drain of the PMOS transistor Q36 is connected to a reference potential source VSS. The NMOS transistor Q40 has a drain connecting to a power supply potential source VDD and a source connecting to the source of the PMOS transistor Q35, and such a junction forms a node ND35. The drain of the PMOS transistor Q37 is connected to a reference potential source VSS. In addition, the gates of the respective NMOS transistors Q39 and Q40 are connected to the source of the PMOS transistor Q35. The gates of the respective PMOS transistors Q36 and Q37 are connected to the source of the NMOS transistor Q38. The node ND34 is connected to the gate of the first slave transistor Q32 and the node ND35 is connected to the gate of the second slave transistor Q34.

The switch SW31 is connected to a current source I35 where a fixed end terminal "a" is connected to the power supply potential source VDD, a fixed terminal "b" is connected to the node ND34, and a fixed terminal "c" is connected to the node ND35. The switch SW32 is connected to a current source I36 where a fixed end terminal "a" is connected to the reference potential source VSS, a fixed terminal "b" is connected to the node ND34, and a fixed terminal "c" is connected to the node ND35.

Next, the operation of the differential output circuit 30 according to the fourth embodiment will be described, mainly focusing on the configuration of a gate drive circuit 31.

In the differential output circuit 30, the gate G31 of a first slave transistor Q32 and the gate 32 of a second slave transistor Q32, which constitute a pair of differential output transistors, are driven by a current source I35 with a switch SW31 and a current source I36 with a switch SW32, respectively. Then, the gates G31 and G32 of the first and second slave transistors Q32 and Q34 are clamped by transistors Q36, Q37, Q39, and Q40, respectively. If the switch SW31 forms a connection between end terminals "a" and "b" to select the gate G31 of the first slave transistor Q32, then a potential is clamped by the transistor Q36. A current source I34 is controlled so that a voltage between the gate and the source (GS voltage) of the transistor Q36 driven by a current source I35 will be equal to the GS voltage of the transistor Q38. Therefore, the voltage of the gate G31 of the first slave transistor Q32 becomes equal to the gate voltage (Ghigh) of the transistor Q38. Thus, the first slave transistor Q32 and the second master transistor Q33 form a current mirror circuit.

At this time, the switch SW32 forms a connection between the end terminals "a" and "c" to select the gate G32 of the second slave transistor Q34. Then, the gate G32 is clamped by the transistor G40. A current source I33 is adjusted so that the GS voltage of the transistor Q40 can be equal to the GS voltage of the transistor Q35. Therefore, the voltage at the gate G32 of the transistor Q34 becomes equal to the gate voltage (Glow) of the transistor Q35, forming a current mirror circuit of the second slave transistor Q34 and the first master transistor Q31.

The currents flown from the first and second master transistor Q31 and Q33 are fixed to the maximum and minimum currents generated from the first and second slave transistors Q32 and Q34. Therefore, an output current, in a state that the gates G31 and G32 of the first and second slave transistors Q32 and Q34 are being clamped, can be determined by a current mirror.

If the switches SW31 and SW32 are switched over from such a state, then the gates G31 and G32 of the first and second slave transistors Q32 and Q34 are changed and the outputs thereof are also changed. When capacitor C31 discharges gate G31 of first slave transistor Q32 according to current source I36 through SW32, voltage falls. At this time, the transistor Q36 is cut-off and the clamp does not function.

If the voltage of the gate G31 of the first slave transistor Q32 falls to a voltage level of Glow, then the transistor Q39 is turned on to clamp the voltage of the gate G31 of the first slave transistor Q32. In contrast to the gate G31, the voltage of the gate G32 of the second slave transistor Q34 is gradually charged from a voltage level of Glow to a voltage level of Ghigh.

If both the current sources I35 and I36 generate the same level of current and both the capacitors C31 and C32 are equal to each other, then a change in voltage of the gate G31 of the first slave transistor Q32 and a change in voltage of the gate G32 of the second slave transistor Q34 are asymmetrical with each other. Likewise, as a result, an output current from the first slave transistor Q32 and an output current from the second slave transistor Q34 are substantially symmetrical with each other. Thus, differential signals with few common-mode components and the sum thereof is substantially constant.

According to the fourth embodiment, differential signals with few common-mode signal components can be advantageously driven and, as a result, low-radiation communication becomes possible.

5. Fifth Embodiment

Figure 7:
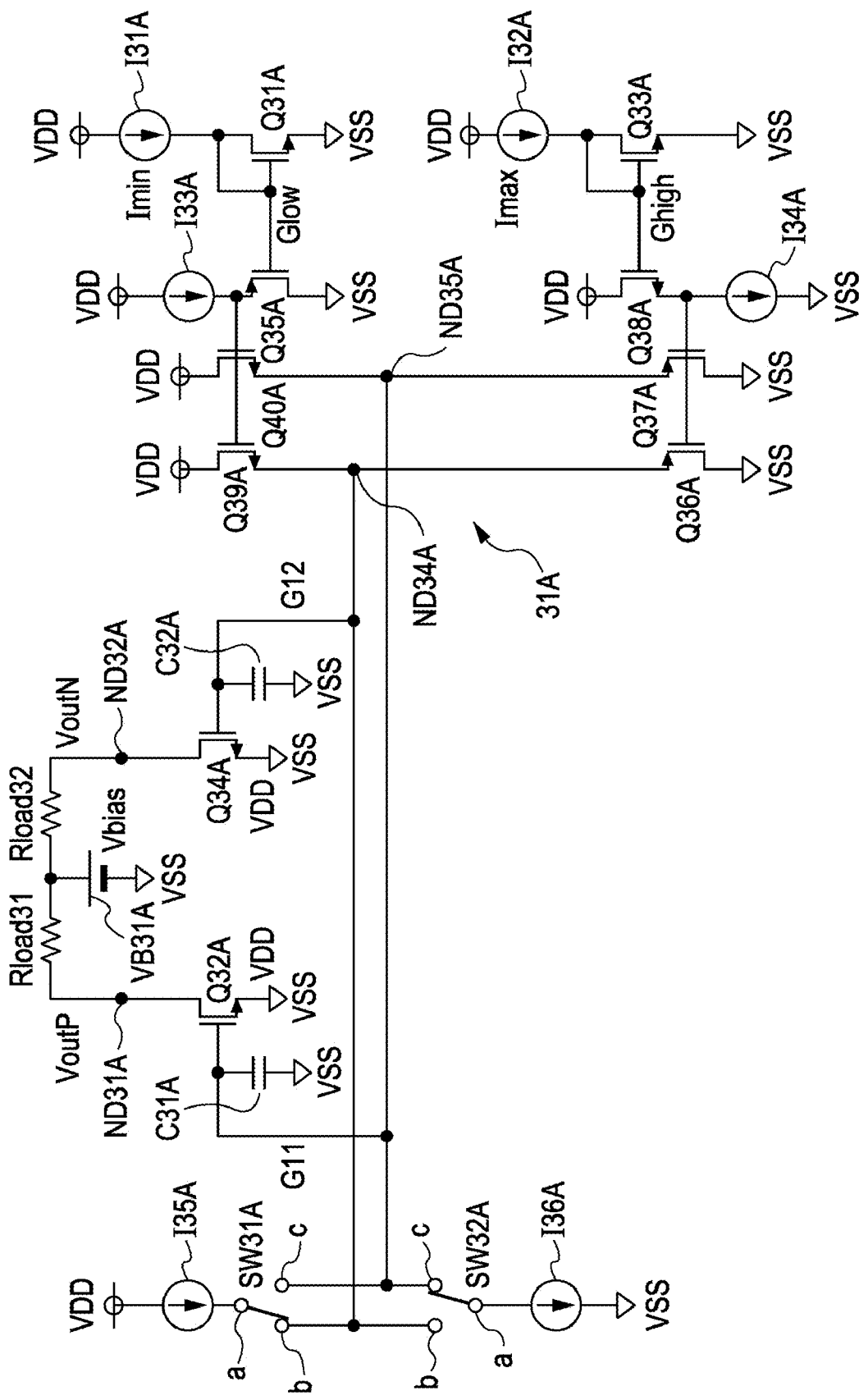
FIG. 7 is a circuit diagram illustrating an exemplary configuration of a differential output circuit according to a fifth embodiment of the present invention.

FIG. 7 is a circuit diagram illustrating an exemplary configuration of a differential output circuit according to a fifth embodiment of the present invention.

The differential output circuit 30A of the fifth embodiment has the same configuration as that of the differential output circuit 30 of the fourth embodiment except that the polarities are reversed.

In FIG. 7, in order to easily understand the configuration of the differential output circuit 30A, the same structural components as those in FIG. 6 are designated by the same reference numerals. A second gate drive circuit 31A shown in FIG. 7 has the same configuration as that of the gate drive circuit shown in FIG. 6. In FIG. 7, furthermore, the same structural components as those shown in FIG. 6 are designated by the same reference numerals with the suffix "A".

The first master transistor Q31A is an NMOS transistor, a field-effect transistor of a second conductivity type, for example, an N-channel type (N-type). The first master transistor Q31A is a so-called diode-connected transistor connecting to a drain and a gate. The source of the transistor Q31A is connected to a reference potential source VSS and the drain and the gate thereof are connected to a current source I31A.

The first slave transistor Q32A is an NMOS transistor, a field-effect transistor of a second conductivity type, for example, an N-channel type (N-type). The first slave transistor Q32A has a drain connecting to the other end of the first load resistor Rload31, and such a junction forms a first output node ND32A. In the first slave transistor Q32A, a source is connected to a reference potential source VSS and a gate is connected to the output of a gate drive circuit 31A. In addition, a capacitor C31A exists between the gate of the transistor Q32A and the reference potential source VSS.

The second master transistor Q33A is an NMOS transistor, a field-effect transistor of a second conductivity type, for example, an N-channel type (N-type). The second master transistor Q33A is a so-called diode-connected transistor connecting to a drain and a gate. The source of the transistor Q33A is connected to a reference potential source VSS and the drain and the gate thereof are connected to a current source 132A.

The second slave transistor Q34A is an NMOS transistor, a field-effect transistor of a second conductivity type, for example, an N-channel type (N-type). The second slave transistor Q34A has a drain connecting to the other end of the second load resistor Rload32, and such a junction forms a second output node ND33A. In the second slave transistor Q34A, a source is connected to a reference potential source VSS and a gate is connected to the output of a gate drive circuit 31A. In addition, a capacitor C32A exists between the gate of the transistor Q32A and the reference potential source VSS.

According to the above configuration of the differential output circuit 30A of the fifth embodiment, almost the same advantageous effects as those of the first embodiment will be obtained.

6. Sixth Embodiment

Figure 8:
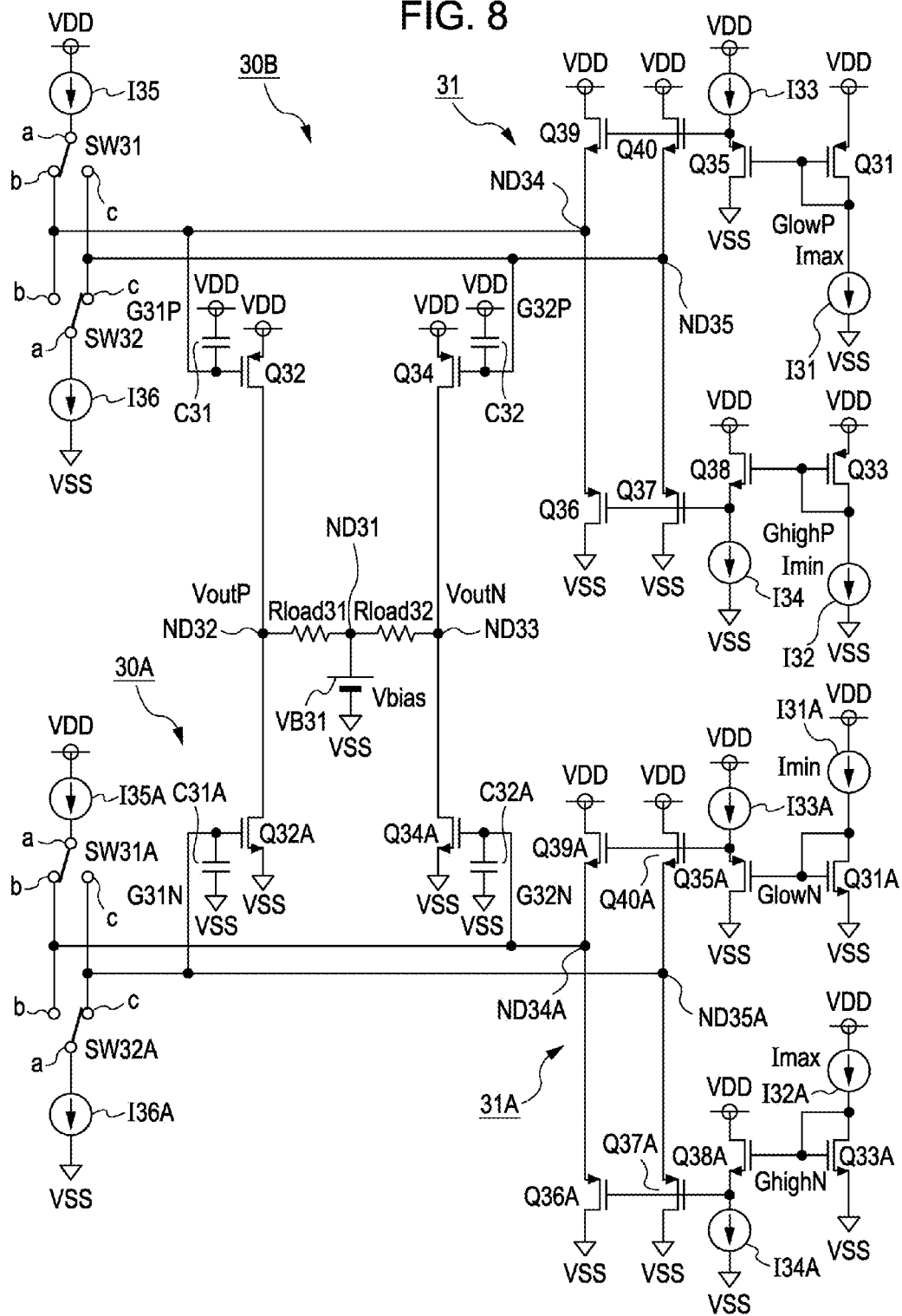
FIG. 8 is a circuit diagram illustrating an exemplary configuration of a differential output circuit according to a sixth embodiment of the present invention.

FIG. 8 is a circuit diagram illustrating an exemplary configuration of a differential output circuit according to a sixth embodiment of the present invention.

The differential output circuit 30B of the sixth embodiment has the same configuration as that of each of the differential output circuits 30 and 30A of the forth and fifth embodiments except for the following: The differential output circuit 30B of the sixth embodiment is formed as a push-pull type differential output circuit including a current-source type differential output circuit formed as a PMOS current mirror circuit of the differential output circuits 30 of the fourth embodiment in addition to the current-sinking type output circuit of the fifth embodiment arranged in parallel therewith.

In this case, a first load resistor Rload31, a second load resistor Rload32, a bias current VB31, and output nodes ND32 and ND33 are shared.

According to the differential output circuit 30B of the sixth embodiment, the same effects as those of the fourth and fifth embodiments can be obtained. In addition, the amount of circuit current used for imparting the same differential output as that of the output can be advantageously reduced to almost half of that of the first embodiment.

Next, a communication device which can employ any of the above differential output circuits 10, 10A, 10B, 30, 30A, and 30B will be described.

7. Seventh Embodiment

Figure 9:
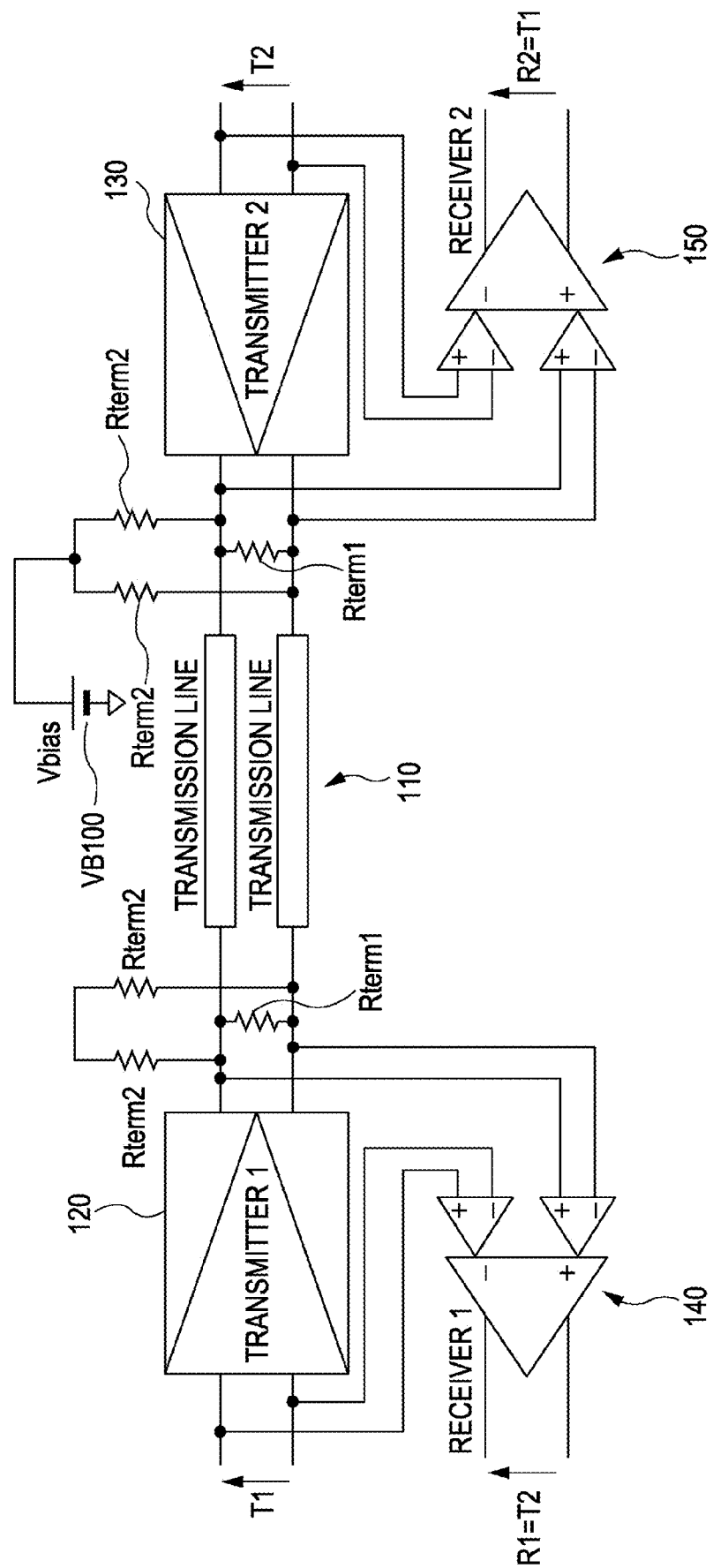
FIG. 9 is a circuit diagram illustrating an exemplary configuration of a communication device according to a seventh embodiment of the present invention.

FIG. 9 is a circuit diagram illustrating an exemplary configuration of a communication device circuit according to a seventh embodiment of the present invention.

A communication device 100 illustrated in FIG. 9 includes transmitters 120 and 130 provided with drivers each including the differential output circuit of any embodiment of the present invention.

In the communication device 100, the transmitters 120 and 130 are arranged on the opposite sides of a differential transmission line 110 to enable two-way transmission.

Specifically, each of the transmitters 120 and 130 includes any of the differential output circuits 10, 10A, 10B, 30, 30A, and 30B of the first to sixth embodiments. The communication device 100 includes receivers 140 and 150 connecting to the respective transmitters 120 and 130 and arranged in parallel with respect to the differential transmission line 110. One end of the differential transmission line 110 is terminated by a terminating resistor Rterm1 near the transmitter 120 and the outputs of the transmitter 120 are connected to a differential transmission line 110 via two termination resisters Rterm2.

The other end of the differential transmission line 110 is terminated by a terminating resistor Rterm1 near the transmitter 130 and connected to a bias power supply VB100 of DC via two terminating resistors Rterm2.

In the communication device 100, for example, a distinct sum signal of signals to be outputted by the transmitters 120 and 130 at both ends is generated across a load. Each of the receivers 140 and 150 provided at both ends of the differential transmission line 110 so as to be in parallel with the transmitters 120 and 130 can obtain a signal of the transmitter at the other end by subtracting the target output of each of the transmitters 120 and 130 arranged in parallel with the receivers 140 and 150 from the sum signal generated across the load.

Therefore, according to the seventh embodiment of the present invention, a two-way simultaneous communication with low radiation can be performed.

8. Eighth Embodiment

Figure 10:
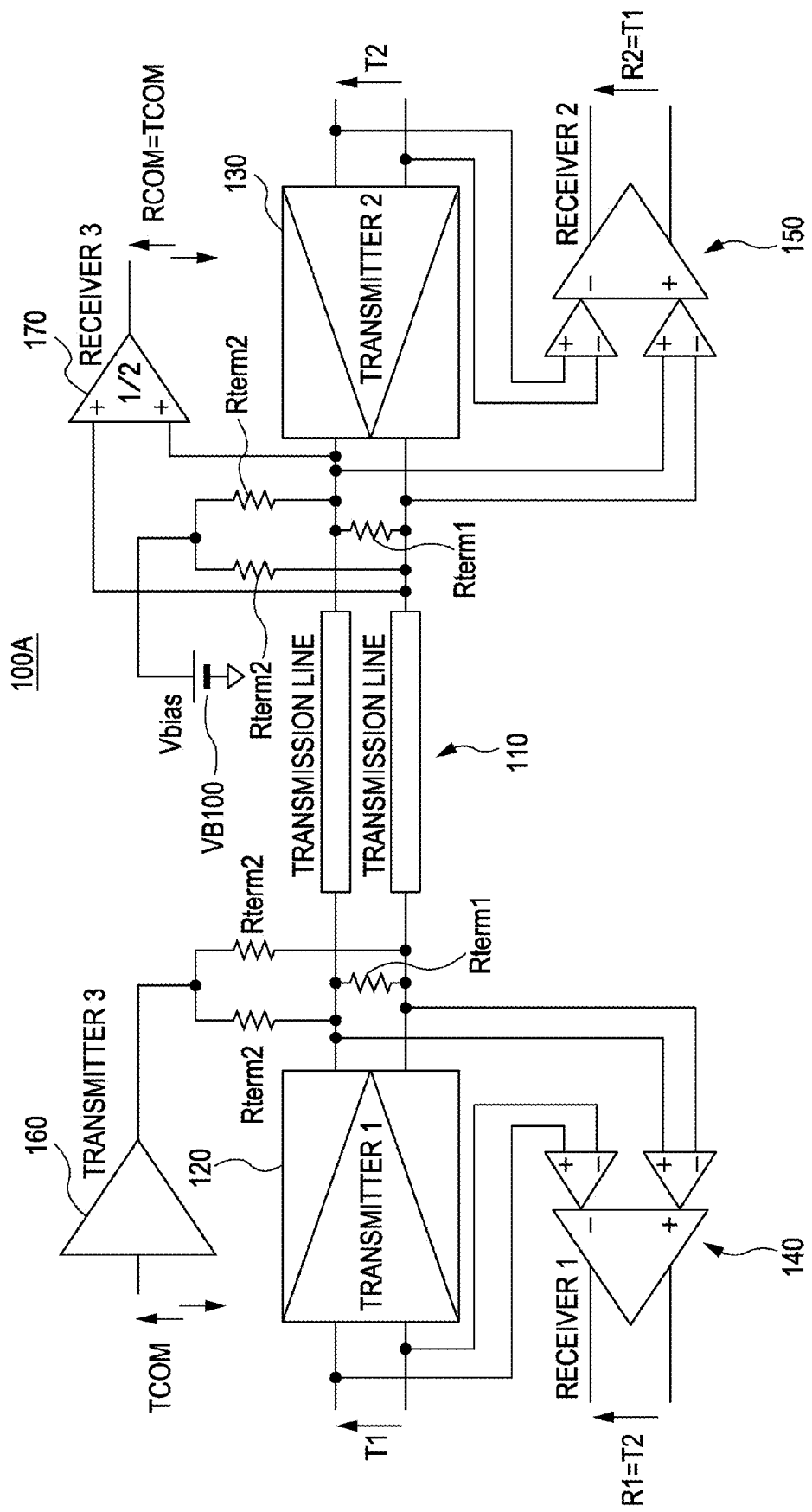
FIG. 10 is a circuit diagram illustrating an exemplary configuration of a communication device according to an eighth embodiment of the present invention.

FIG. 10 is a circuit diagram illustrating an exemplary configuration of a communication device according to an eighth embodiment of the present invention.

The communication device 100A of the eighth embodiment includes, in addition to the same structural components as those of the communication device 100 of the seventh embodiment, a transmitter 160 arranged on the part of the transmitter 120 and a receiver 17 arranged on the part of the transmitter 130.

One end of the differential transmission line 110 is terminated by a terminating resistor Rterm1 near the transmitter 120 and the outputs of the transmitter 120 are connected to a differential transmission line 110 via two termination resisters Rterm2. The other end of the differential transmission line 110 is terminated by a terminating resistor Rterm1 near the transmitter 130 and connected to the bias power supply VB100 of DC via two terminating resistors Rterm2. Furthermore, a receiver 170 is connected to the other end of the differential transmission line 110.

Specifically, for example, each of the transmitters 120 and 130 includes any of the differential output circuits 10, 10A, 10B, 30, 30A, and 30B of the first to sixth embodiments. The differential output circuit (output circuit) according to this embodiment outputs an accurate differential current at all times irrespective of the potential of the output. Therefore, even when another signal at a common-mode potential is superimposed on the differential signal pair, there are no disturbances in the differential signal, and there is little leakage to the common-mode signal accompanying differential signal drive which causes noise for the common-mode signal.

As described above, in the communication device 100A according to the eighth embodiment, the differential transmission line 110 is terminated in parallel by a single resistor Rterm1 and two serial resistors Rterm2 (-1, -2). The node connecting two Rterm2 is driven by a low impedance signal driver in transmitter 160 on the end of transmitter 120, and is biased with a DC voltage on the end of transmitter 130. As for the impedance when the transmitter is seen from the differential transmission line 110, the parallel resistances of the terminating resistors Rterm1 and Rterm2 can be observed in differential mode and two parallel resistors of the terminating resistor Rterm2 can be observed in common-mode. For example, supposing that the terminating resistor Rterm1 is 1 kΩ, and the terminating resistor Rterm2 is 56Ω, this means that the differential transmission line 110 is terminated with approximately 100Ω in differential mode, and with 28Ω in common-mode, thus realizing impedance matching to 100Ω in the differential mode and 30Ω in the common-mode, which are typical for a paired transmission line with electromagnetic coupling. When a common-mode voltage signal is sent to such a transmission line from the transmitter 160, the receiver 170 can receive a signal as the average voltage of a differential pair. This transmission is realized without interference with differential signal transmission from the transmitter 120 to the receiver 150 and differential signal transmission from the transmitter 130 to the receiver 140.

As described above, the communication device 100A of the eighth embodiment can transmit additional data simultaneously or asynchronously with data of differential signals by addition of a common-mode signal drive circuit. Any of the differential output circuits according to the first to sixth embodiments shows only a small disturbance in common-mode voltage accompanied with a change in differential signal, so that it will realize a stable common-mode signal communication.

9. Ninth Embodiment

Figure 11:
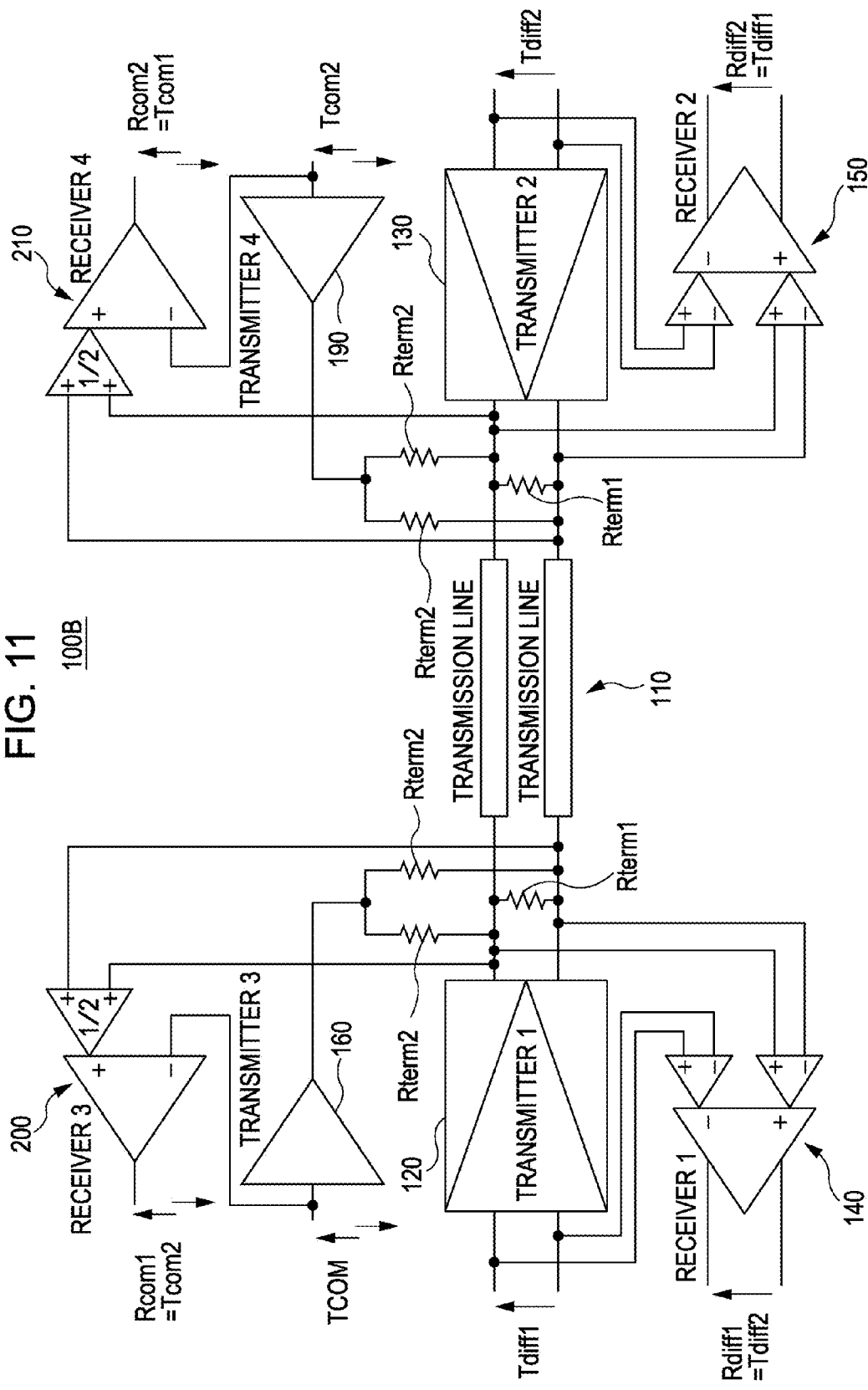
FIG. 11 is a circuit diagram illustrating an exemplary configuration of a communication device according to a ninth embodiment of the present invention.

FIG. 11 is a circuit diagram illustrating an exemplary configuration of a communication device according to a ninth embodiment of the present invention.

In a communication device 100B according to the ninth embodiment, a receiver 200 is arranged in parallel with the transmitter 160 on one end side of the differential transmission line 110, and a transmitter 190 and a receiver 210 are likewise connected in parallel on the other end side.

In the communication device 100B, common-mode signal transmission is also realized without the two-way communications from the transmitter 160 to the receiver 210 and from the transmitter 190 to the receiver 200 coming into interference with each other in a simultaneous, parallel manner.

10. Tenth Embodiment

Figure 12:
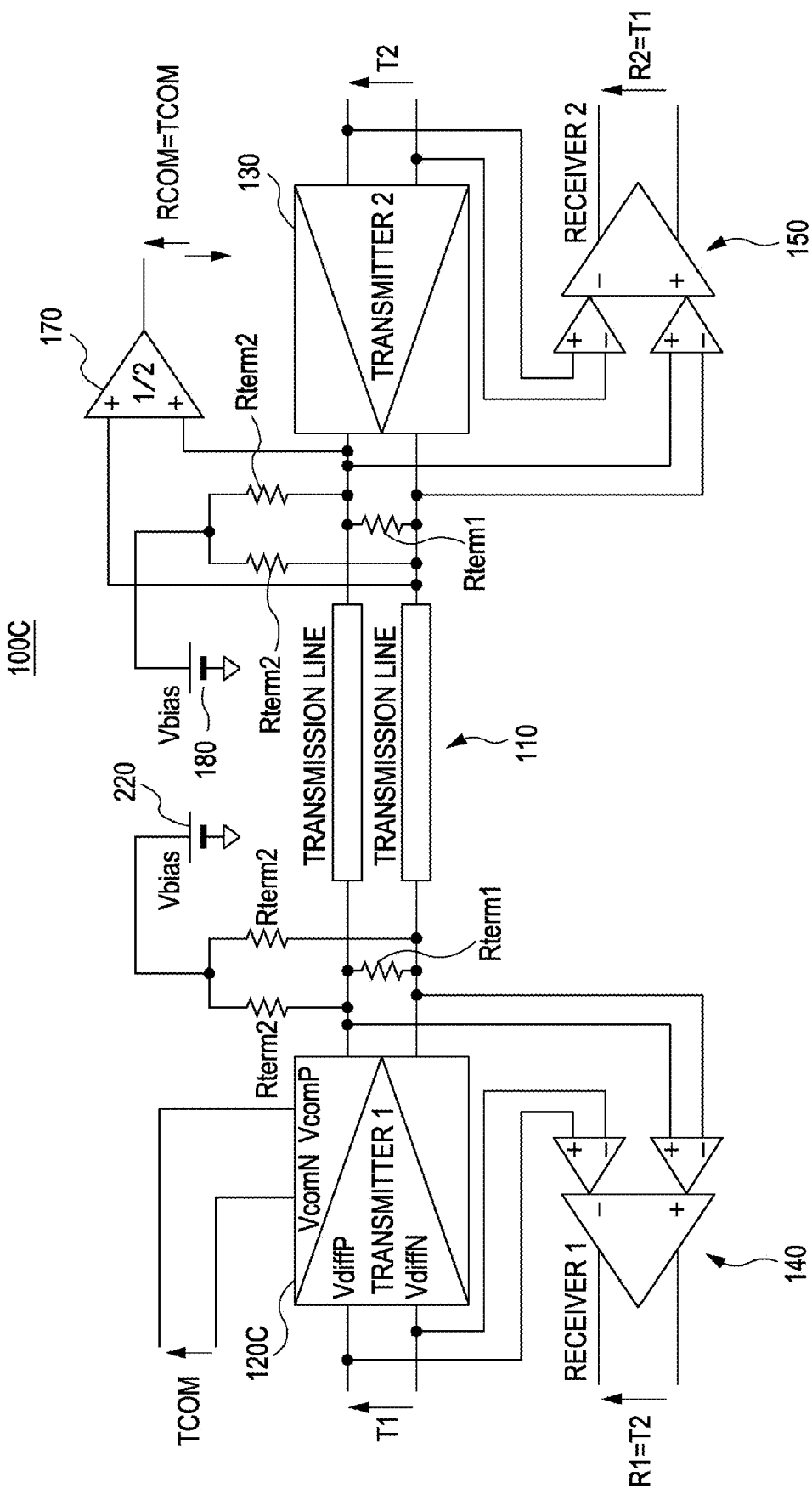
FIG. 12 is a circuit diagram illustrating an exemplary configuration of a communication device according to a tenth embodiment of the present invention.

FIG. 12 is a circuit diagram illustrating an exemplary configuration of a differential output circuit according to a tenth embodiment of the present invention.

The communication device 100C according to the tenth embodiment differs from the communication device 100A of the eighth embodiment in that the differential output circuit 10A of the second embodiment is applied to the transmitter 120C on one end side of the differential transmission line 110. Also, the communication device 100C has a bias power supply 220 instead of the transmitter 160, and one end side of the differential transmission line 110 is biased with a DC voltage through the resistors Rterm2.

According to the communication device 100C of the tenth embodiment, common-mode signals are not fluctuated even during the changes of differential signals. Thus, communication with common-mode signals of small amplitudes can be superimposed simultaneously and asynchronously with the differential simultaneous two-way communication. In addition, simultaneous asynchronous communication with differential signals and common-mode signals is possible in a simple drive circuit.

11. Eleventh Embodiment

Figure 13:
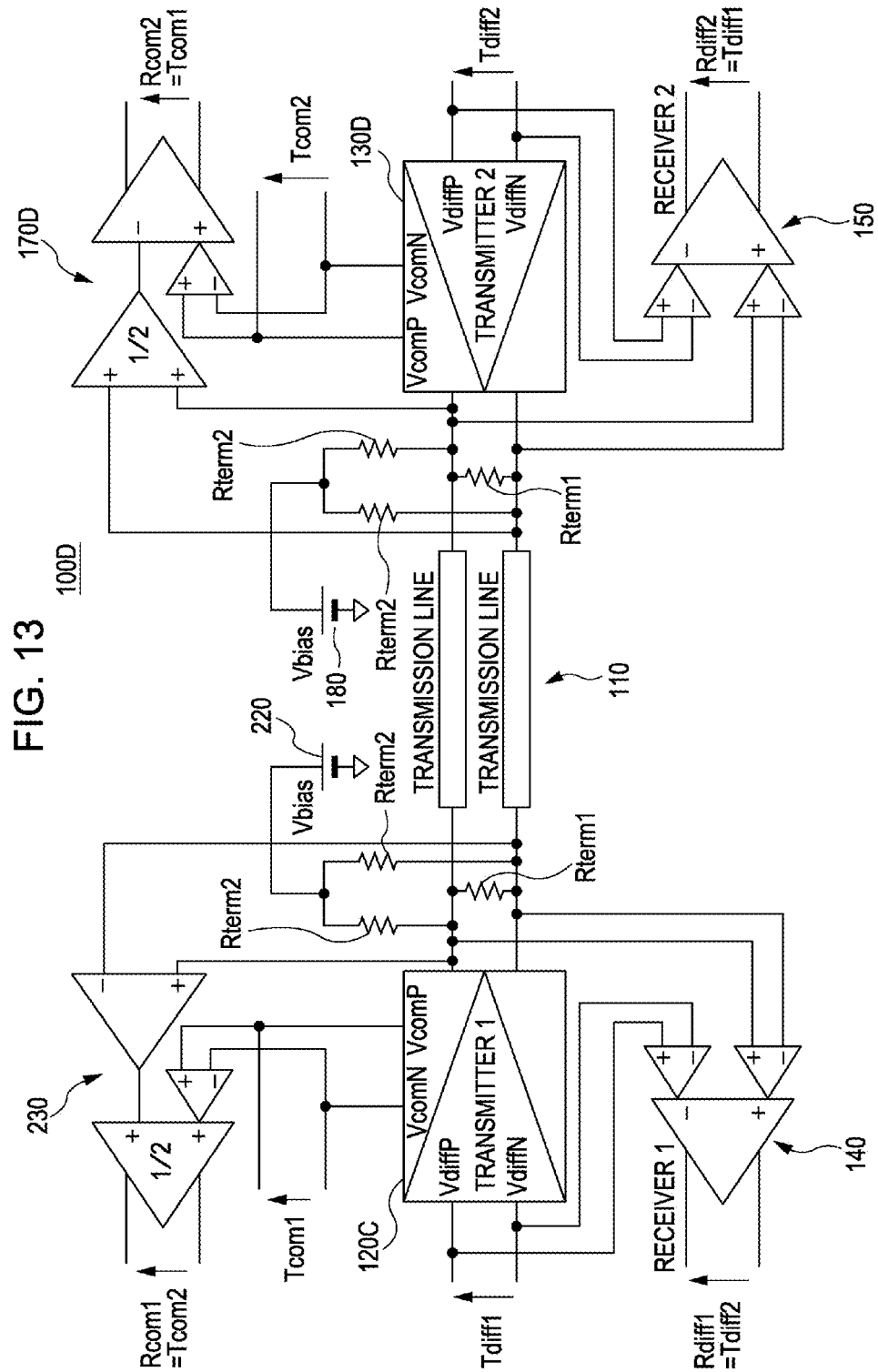
FIG. 13 is a circuit diagram illustrating an exemplary configuration of a communication device according to an eleventh embodiment of the present invention.

FIG. 13 is a circuit diagram illustrating an exemplary configuration of a communication device according to an eleventh embodiment of the present invention.

The communication device 100D according to the eleventh embodiment differs from the communication device 100C of the tenth embodiment in that the differential output circuit 10A of the second embodiment is also applied to the transmitter 130D on the other end side of the differential transmission line 110. Furthermore, a receiver 230 is connected in parallel with the transmitter 120C.

According to the eleventh embodiment, simultaneous two-way transmission of common-mode signals can be performed using the differential output circuit 10A of the second embodiment. According to the communication device 100D of the eleventh embodiment, common-mode signals are not fluctuated even during the changes of differential signals. Thus, communication with common-mode signals of small amplitudes can be superimposed simultaneously and asynchronously with the differential simultaneous two-way communication.

In addition, simultaneous asynchronous communication with differential signals and common-mode signals is possible in a simple drive circuit.

12. Twelfth Embodiment

Figure 14A:
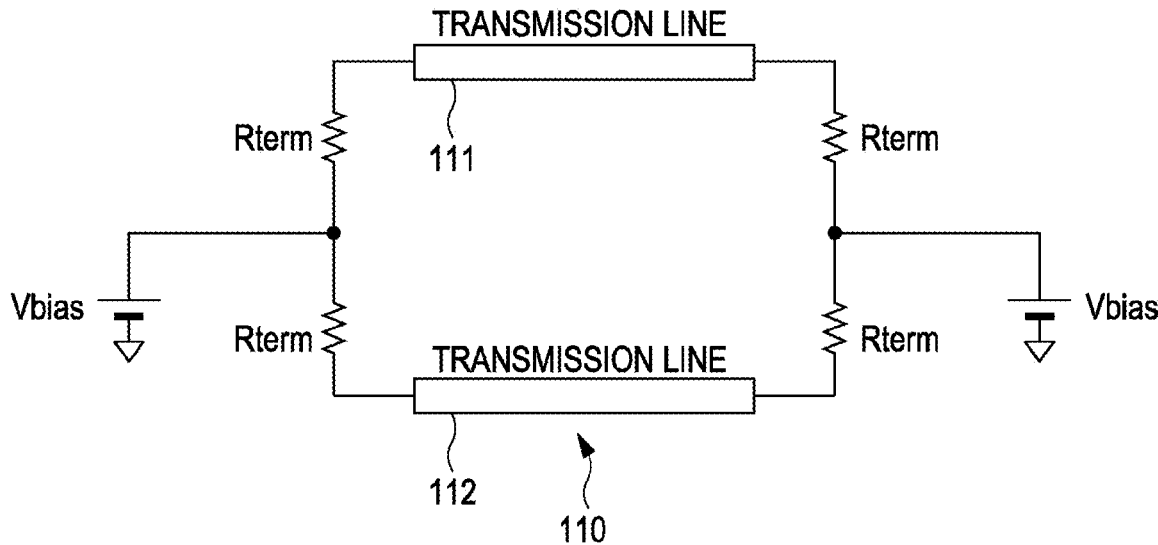
FIG. 14 is a circuit diagram illustrating an exemplary configuration of a termination circuit of a communication system according to a twelfth embodiment of the present invention.
Figure 14B:
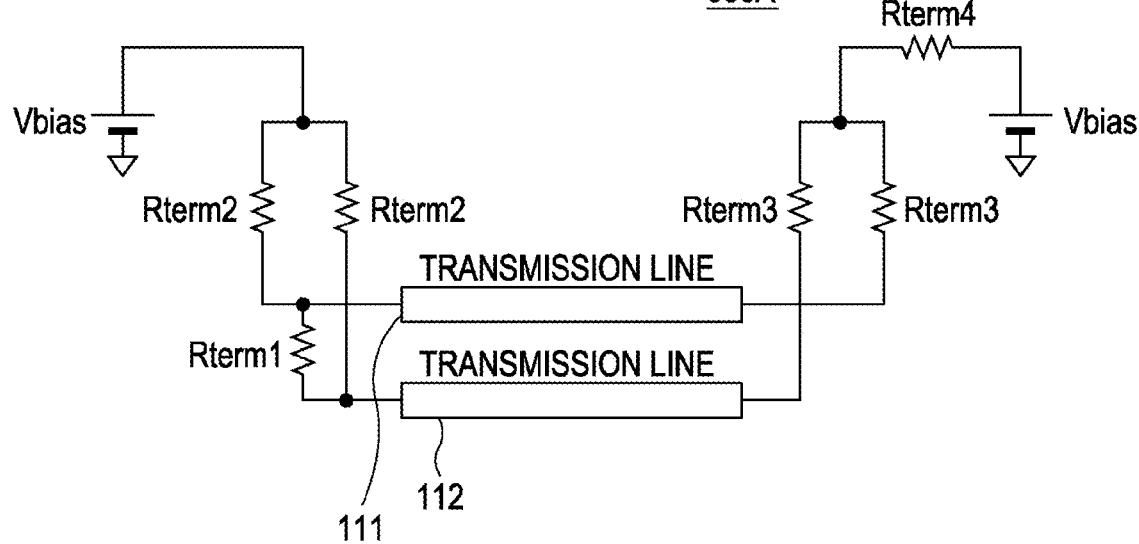

FIG. 14 is a circuit diagram illustrating an exemplary configuration of a termination circuit according to a twelfth embodiment of the present invention, where FIG. 14A illustrates the configuration of a termination circuit 300 and FIG. 14B illustrates the configuration of a termination circuit 300A.

If there is no electromagnetic combination between two transmission lines 111 and 112 that form a differential transmission line 110, the termination circuit functions as follows: The characteristic impedance of even-mode transmission generated when the same signals are applied to both the transmission lines 111 and 112 is one-fourth the impedance of odd-mode transmission when differential signals with reversed polarities are applied on both transmission lines. Therefore, like the termination circuit 300 shown in FIG. 14A, if a resistance Rterm half of the odd-mode characteristic impedance is used for termination, matching termination is attained in both even and odd modes.

However, in the case of a differential transmission line formed using UTP, STP, a micro-strip line, and so on, two transmission lines are proximal to each other and their electromagnetic fields may combine. Thus, the characteristic impedance of even-mode transmission hardly corresponds to one-fourth the odd-mode impedance. In this case, as shown in FIG. 14B, the use of a combination of two different resistors, Rterm1 and Rterm2 or Rterm3 and Rterm4, leads to matching termination in both even and odd modes. The circuit constant used for the matching is as follows:

$R\text{term}2/2 = \text{even-mode characteristic impedance}$ $1/R\text{term}1 + 1/(2*R\text{term}2) = 1/\text{odd-mode characteristic impedance}$ $R\text{term}3/2 + R\text{term}4 = \text{even-mode characteristic impedance}$ $2*R\text{term}3 = \text{odd-mode characteristic impedance}$ For example, the circuit constant is determined as follows when a transmission line with an even-mode characteristic impedance level of 30Ω and an odd-mode characteristic impedance level of 100Ω is matching-terminated in both even and odd modes.
Rterm1=600Ω
Rterm2=60Ω

Rterm3=50Ω
Rterm4=5Ω

According to the twelfth embodiment, a typical transmission line having an electromagnetic interference between the paired lines can be matching-terminated in both even and odd modes. Thus, even if any signal passes through the differential transmission line, it can be absorbed without reflecting on the terminating end and a stable communication can be performed without causing any reflection noise.

In addition, it can suppress an increase in radiation by reflection.

According to the communication device that employs such a termination circuit, no reflection noise occurs. Thus, simultaneous and asynchronous communication of differential signals and common-mode signals can be stably realized.

Furthermore, the configuration of the differential output circuit having a superimposing section that superimposes a common-mode signal according to the second embodiment is also applicable to the differential output circuit according to any of the third to sixth embodiments.

The present application contains subject matter related to that disclosed in Japanese Priority Patent Application JP 2008-290189 filed in the Japan Patent Office on Nov. 12, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A differential output circuit comprising:
a first current mirror circuit;
a second current mirror circuit;
a first load resistor and a second load resistor that are connected at respective ends; and
a bias power supply to bias a connecting node between a first end of said first load resistor and a first end of said second load resistor to a predetermined potential, wherein
said first current mirror circuit comprises:
   a first master transistor having a gate and a drain,
   a first current source connected to said drain of said first master transistor,
   a first slave transistor having a drain connected to a second end of said first load resistor, and
   a first voltage follower to supply a first gate voltage of said first master transistor to a gate of said first slave transistor, where a first slew rate at a rise time is equal to a first slew rate at a fall time, and
said second current mirror circuit comprises:
   a second master transistor having a gate and a drain,
   a second current source connected to said drain of said second master transistor,
   a second slave transistor having a drain connected to a second end of said second load resistor, and
   a second voltage follower to supply a second gate voltage of said second master transistor to a gate of said second slave transistor, where a second slew rate at a rise time is equal to a second slew rate at a fall time.

2. The differential output circuit according to claim 1, further comprising:
a third current mirror circuit; and
a fourth current mirror circuit, wherein
said first current mirror circuit comprises:
   a first-conductive type first master transistor having a gate and a drain,
   the first current source connected to said drain of said first-conductive type first master transistor,
   a first-conductive type first slave transistor having a drain connected to the second end of said first load resistor, and
   the first voltage follower to supply the first gate voltage of said first-conductive type first master transistor to a gate of said first-conductive type first slave transistor, where the first slew rate at a rise time is equal to the first slew rate at a fall time,
said second current mirror circuit comprises:
   a first-conductive type second master transistor having a gate and a drain,
   the second current source connected to said drain of said first-conductive type second master transistor,
   a first-conductive type second slave transistor having a drain connected to the second end of said second load resistor, and
   the second voltage follower to supply the second gate voltage of said first-conductive type second master transistor to a gate of said first-conductive type second slave transistor, where the second slew rate at a rise time is equal to the second slew rate at a fall time,
said third current mirror circuit comprises:
   a second-conductive type third master transistor having a gate and a drain,
   a third current source connected to said drain of said second-conductive type third master transistor,
   a second-conductive type third slave transistor having a drain connected to the second end of said first load resistor, and
   a third voltage follower to supply a third gate voltage of said second-conductive type third master transistor to a gate of said second-conductive type third slave transistor, where a third slew rate at a rise time is equal to a third slew rate at a fall time, and
said fourth current mirror circuit comprises:
   a second-conductive type fourth master transistor having a gate and a drain,
   a fourth current source connected to said drain of said second-conductive type fourth master transistor,
   a second-conductive type fourth slave transistor having a drain connected to the second end of said second load resistor, and
   a fourth voltage follower to supply a fourth gate voltage of said second-conductive type fourth master transistor to a gate of said second-conductive type fourth slave transistor, where a fourth slew rate at a rise time is equal to a fourth slew rate at a fall time.

3. A differential output circuit comprising:
a first load resistor and a second load resistor connected at respective ends;
a bias power supply to bias a connecting node between a first end of said first load resistor and a first end of said second load resistor to a predetermined potential;
a gate drive circuit;
a first master transistor having a gate and a drain;
a first current source connected to said drain of said first master transistor;
a first slave transistor having a drain connected to a second end of said first load resistor;
a second master transistor having a gate and a drain;
a second current source connected to said drain of said second master transistor; and
a second slave transistor having a drain connected to a second end of said second load resistor, wherein first gate voltages are supplied from said first master transistor and said second master transistor to said gate drive circuit,
a first upper clamp level and a first lower clamp level are set to said first gate voltages of said first slave transistor and said second slave transistor,
a first voltage is changed from the first upper clamp level to the first lower clamp level at a first predetermined slew rate,
said first voltage is supplied to said gate of said first slave transistor and said gate of said second slave transistor, and
a first current mirror is formed using said first master transistor and said first slave transistor and a second current mirror is formed using said second master transistor and said second slave transistor, or a first current mirror is formed using said first master transistor and said second slave transistor and a second current mirror is formed using said second master transistor and said first slave transistor.

4. The differential output circuit according to claim 3, further comprising:
a third master transistor having a gate and a drain;
a third current source connected to said drain of said third master transistor;
a third slave transistor having a drain connected to the second end of said first load resistor;
a fourth master transistor having a gate and a drain;
a fourth current source connected to said drain of said fourth master transistor;
a fourth slave transistor having a drain connected to the second end of said second load resistor;
a first gate drive circuit; and
a second gate drive circuit, wherein
each of said first master transistor, said second master transistor, said first slave transistor, and said second slave transistor is formed of a first-conductive type transistor,
each of said third master transistor, said fourth master transistor, said third slave transistor, and said fourth slave transistor is formed of a second-conductive type transistor,
second gate voltages are supplied from said third master transistor and said fourth master transistor to said second gate drive circuit,
a second upper clamp level and a second lower clamp level are set to said second gate voltages from said third slave transistor and said fourth slave transistor,
a second voltage is changed from the second upper clamp level to the second lower clamp level at a second predetermined slew rate,
said second voltage is supplied to said gate of said third slave transistor and said gate of said fourth slave transistor, and
a third current mirror is formed using said third master transistor and said third slave transistor and a fourth current mirror is formed using said fourth master transistor and said fourth slave transistor, or a third current mirror is formed using said third master transistor and said fourth slave transistor and a fourth current mirror is formed using said fourth master transistor and said third slave transistor.

5. The differential output circuit according to any one of claims 1 to 4, further comprising:
a superimposing section to superimpose a common-mode signal in addition to a differential signal on a master current of each of said current mirror circuits.

6. A communication device comprising:
a plurality of transmitters arranged on both end sides of a differential transmission line, wherein
each of said transmitters includes a differential output circuit capable of supplying a differential output to said differential transmission line, where
said differential output circuit comprises:
a first current mirror circuit,
a second current mirror circuit,
a first load resistor and a second load resistor connected at respective ends, and
a bias power supply to bias a connecting node between a first end of said first load resistor and a first end of said second load resistor to a predetermined potential, where
said first current mirror circuit comprises:
a first master transistor having a gate and a drain,
a first current source connected to said drain of said first master transistor,
a first slave transistor having a drain connected to a second end of said first load resistor, and
a first voltage follower to supply a first gate voltage of said first master transistor to said gate of said first slave transistor, where a first slew rate at a rise time is equal to a first slew rate at a fall time,
said second current mirror circuit includes
a second master transistor having a gate and a drain,
a second current source connected to said drain of said second master transistor,
a second slave transistor having a drain connected to a second end of said second load resistor, and
a second voltage follower that supplies a second gate voltage of said second master transistor to said gate of said second slave transistor, where a second slew rate at a rise time is equal to a second slew rate at a fall time.

7. The communication device according to claim 6, further comprising:
a third current mirror circuit; and
a fourth current mirror circuit, wherein
said first current mirror circuit includes
a first-conductive type first master transistor having a gate and a drain,
the first current source connected to said drain of said first-conductive type first master transistor,
a first-conductive type first slave transistor having a drain connected to the second end of said first load resistor, and
the first voltage follower to supply the first gate voltage of said first-conductive type first master transistor to a gate of said first-conductive type first slave transistor, where the first slew rate at a rise time is equal to the first slew rate at a fall time,
a first-conductive type second master transistor having a gate and a drain;
the second current source connected to said drain of said first-conductive type second master transistor;
a first-conductive type second slave transistor having a drain connected to the second end of said second load resistor, and
the second voltage follower to supply the second gate voltage of said first-conductive type second master transistor to a gate of said first-conductive type second slave transistor, where the second slew rate at a rise time is equal to the second slew rate at a fall time,
said third current mirror circuit comprises:

a second-conductive type third master transistor having a gate and a drain, a third current source connected to said drain of said third master transistor, a second-conductive type third slave transistor having a drain connected to the second end of said first load resistor, and a third voltage follower to supply a third gate voltage of said third master transistor to said gate of said third slave transistor, where a third slew rate at a rise time is equal to a third slew rate at a fall time, and said fourth current mirror circuit comprises:

a second-conductive type fourth master transistor having a gate and a drain, a fourth current source connected to said drain of said second-conductive type fourth master transistor, a second-conductive type fourth slave transistor having a drain connected to the second end of said second load resistor, and a fourth voltage follower that supplies a fourth gate voltage of said second-conductive type fourth master transistor to a gate of said second-conductive type fourth slave transistor, where a fourth slew rate at a rise time is equal to a fourth slew rate at a fall time.

8. A communication device comprising:

a plurality of transmitters arranged on both end sides of a differential transmission line, wherein each of said transmitters includes a differential output circuit capable of supplying a differential output to said differential transmission line, where said differential output circuit comprises:

a first load resistor and a second load resistor connected at respective ends, a bias power supply to bias a connecting node between a first end of said first load resistor and a first end of said second load resistor to a predetermined potential, a first gate drive circuit, a first master transistor having a gate and a drain, a first current source connected to said drain of said first master transistor, a first slave transistor having a drain connected to a second end of said first load resistor, a second master transistor having a gate and a drain, a second current source connected to said drain of said second master transistor, and a second slave transistor having a drain connected to a second end of said second load resistor, and first gate voltages are supplied from said first master transistor and said second master transistor to said first gate drive circuit, a first upper clamp level and a first lower clamp level are set to said gate voltages from said first slave transistor and said second slave transistor, a first voltage is changed from the first upper clamp level to the first lower clamp level at a first predetermined slew rate, said first voltage is supplied to said gate of said first slave transistor and said gate of said second slave transistor, and a first current mirror is formed using said first master transistor and said first slave transistor and a second current mirror is formed using said second master transistor and said second slave transistor, or a first current mirror is formed using said first master transistor and said second slave transistor and a second current mirror is formed using said second master transistor and said first slave transistor.

9. The communication device according to claim 8, further comprising:

a third master transistor having a gate and a drain;

a third current source connected to said drain of said third master transistor;

a third slave transistor having a drain connected to the second end of said first load resistor;

a fourth master transistor having a gate and a drain;

a fourth current source connected to said drain of said fourth master transistor;

a fourth slave transistor having a drain connected to the second end of said second load resistor;

a first gate drive circuit; and a second gate drive circuit, wherein each of said first master transistor, said second master transistor, said first slave transistor, and said second slave transistor is formed of a first-conductive type transistor, each of said third master transistor, said fourth master transistor, said third slave transistor, and said fourth slave transistor is formed of a second-conductive type transistor, second gate voltages are supplied from said third master transistor and said fourth master transistor to said second gate drive circuit, a second upper clamp level and a second lower clamp level are set to said second gate voltages from said third slave transistor and said fourth slave transistor, a second voltage is changed from the second upper clamp level to the second lower clamp level at a second predetermined slew rate, said second voltage is supplied to said gate of said third slave transistor and said gate of said fourth slave transistor, and a third current mirror is formed using said third master transistor and said third slave transistor and a fourth current mirror is formed using said fourth master transistor and said fourth slave transistor, or a third current mirror is formed using said third master transistor and said fourth slave transistor and a fourth current mirror is formed using said fourth master transistor and said third slave transistor.

10. The communication device according to any one of claims 6 to 9, further comprising:

a superimposing section to superimpose a common-mode signal in addition to a differential signal on a master current of each of said current mirror circuits.

11. The communication device according to claim 10, further comprising:

simultaneous and asynchronous common-mode signals with respect to said differential signal are transmitted using a common-mode potential of said differential transmission line.

12. The communication device according to claim 11, wherein the transmitted common-mode signals are simultaneous two-way communication.

13. The communication device according to claim 12, further comprising:

a termination circuit adjusted to both odd-mode transmission and even-mode transmission of said differential transmission line using delta- or Y-connected three resistances.

* * * * *